United States Patent [19]

Pierce et al.

[11] Patent Number: 4,837,447

[45] Date of Patent: Jun. 6, 1989

[54] RASTERIZATION SYSTEM FOR CONVERTING POLYGONAL PATTERN DATA INTO A BIT-MAP

[75] Inventors: John L. Pierce, Hillsborough; Nick Kanopoulos, Durham, both of N.C.

[73] Assignee: Research Triangle Institute, Inc., Research Triangle Park, N.C.

[21] Appl. No.: 860,216

[22] Filed: May 6, 1986

[51] Int. Cl.[4] .............................................. G21K 1/00
[52] U.S. Cl. ................................ 250/492.2; 250/398; 382/56; 364/490; 364/491; 364/521; 340/747
[58] Field of Search .......................... 250/492.22, 398; 364/488, 489, 490, 491, 518, 521; 382/56; 340/747

[56] References Cited

U.S. PATENT DOCUMENTS

| | | | |
|---|---|---|---|
| 3,925,776 | 12/1975 | Swallow | 340/717 |
| 4,145,597 | 3/1979 | Yasuda | 250/492.2 |
| 4,147,937 | 4/1979 | Buelow et al. | 250/492.2 |
| 4,258,265 | 3/1981 | Sumi | 250/492.3 |
| 4,259,724 | 3/1981 | Sugiyama | 364/491 |
| 4,267,456 | 5/1981 | Hidai et al. | 250/398 |
| 4,280,186 | 7/1981 | Hidai et al. | 250/492.22 |
| 4,291,231 | 9/1981 | Hidai et al. | 250/492.3 |
| 4,387,433 | 6/1983 | Cardenia et al. | 250/492.2 |
| 4,433,384 | 2/1984 | Berrian et al. | 364/490 |
| 4,445,039 | 4/1984 | Yew | 250/492.2 |
| 4,477,729 | 10/1984 | Chang et al. | 250/492.22 |
| 4,482,810 | 11/1984 | Cooke | 250/492.22 |
| 4,489,241 | 12/1984 | Matsuda | 250/492.2 |
| 4,511,980 | 4/1985 | Watanabe | 364/491 |
| 4,528,634 | 7/1985 | Nakahata et al. | 364/491 |
| 4,532,598 | 7/1985 | Shibayama et al. | 250/398 |
| 4,538,232 | 8/1985 | Koyama | 250/492.22 |
| 4,594,673 | 6/1986 | Holly | 364/521 |
| 4,630,234 | 12/1986 | Holly | 364/900 |
| 4,633,505 | 12/1986 | Marshall | 382/56 |
| 4,635,208 | 1/1987 | Coleby et al. | 364/491 |
| 4,709,231 | 11/1987 | Sakaibara et al. | 340/747 |

*Primary Examiner*—Janice A. Howell
*Assistant Examiner*—John A. Miller
*Attorney, Agent, or Firm*—Oblon, Fisher, Spivak, McClelland & Maier

[57] ABSTRACT

A real-time rasterization system for converting plural polygonal pattern data into respective bits of a two-dimensional bit-map, wherein the respective bits of the bit-map and the locations thereof within the bit-map correspond to the shapes and locations of the polygons in a two-dimensional field and wherein the bit-map is divided into plural data stripes, each including plural scan lines having plural bits. The rasterization system converts the plural pattern data of a data stripe into plural linked data entries such that data entries which correspond to polygons intersecting the same scan line are sequentially linked, and includes a double buffer pattern data memory for storing the plural linked data entries; a processor for determining for each scan line the bits thereof intersected by each polygon represented by the respective linked data entries and for producing bit-map data corresponding to the determined bits; a double-buffer bit-map memory coupled to the processor for storing the bit-map data for each scan line of the data stripe; and a double-buffer output register for reading out sequentially the bit-map data stored in the bit-map memory.

56 Claims, 19 Drawing Sheets

FIELDS (ALL 32 BIT WORDS)

| 31 | 0 | |
|---|---|---|
| | | POINTER OR XMIN |
| BOTTOM | TOP | TOP AND BOTTOM SLOPES |
| STOP | START | CURRENT START AND STOP (BIT ADDRESSES) |
| STOP | START | ORIGINAL START AND STOP (BIT ADDRESSES) |
| XMAX | REPEAT | REPEAT AND XMAX |
| | | XORIGIN |
| | | INTERVAL |

EXTENDED TABLE FORMAT

TOP SLOPE = $\dfrac{\Delta Y_2}{W}$

BOTTOM SLOPE = $\dfrac{\Delta Y_1}{W}$

ORIGINAL START = Y
ORIGINAL STOP = Y + H

XORIGIN = X
XMAX = X + W

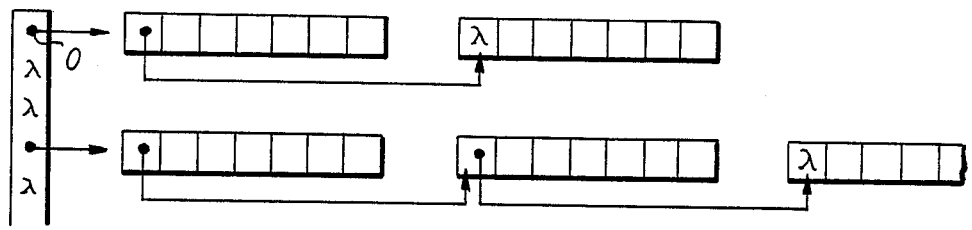
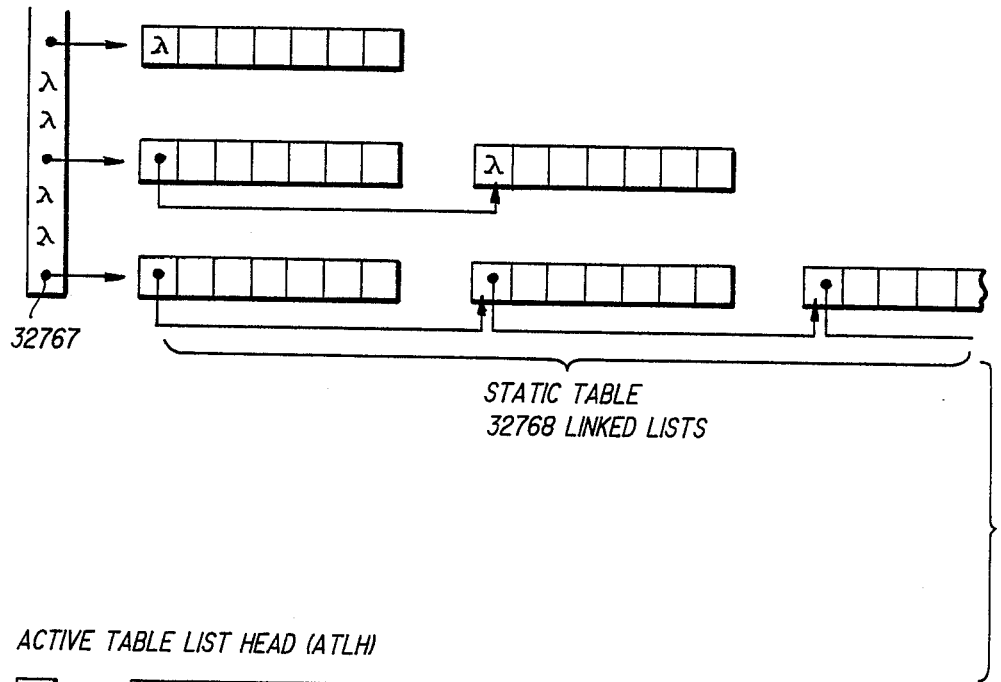
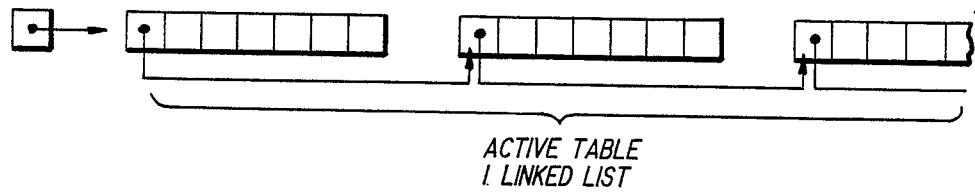
FIG. 10

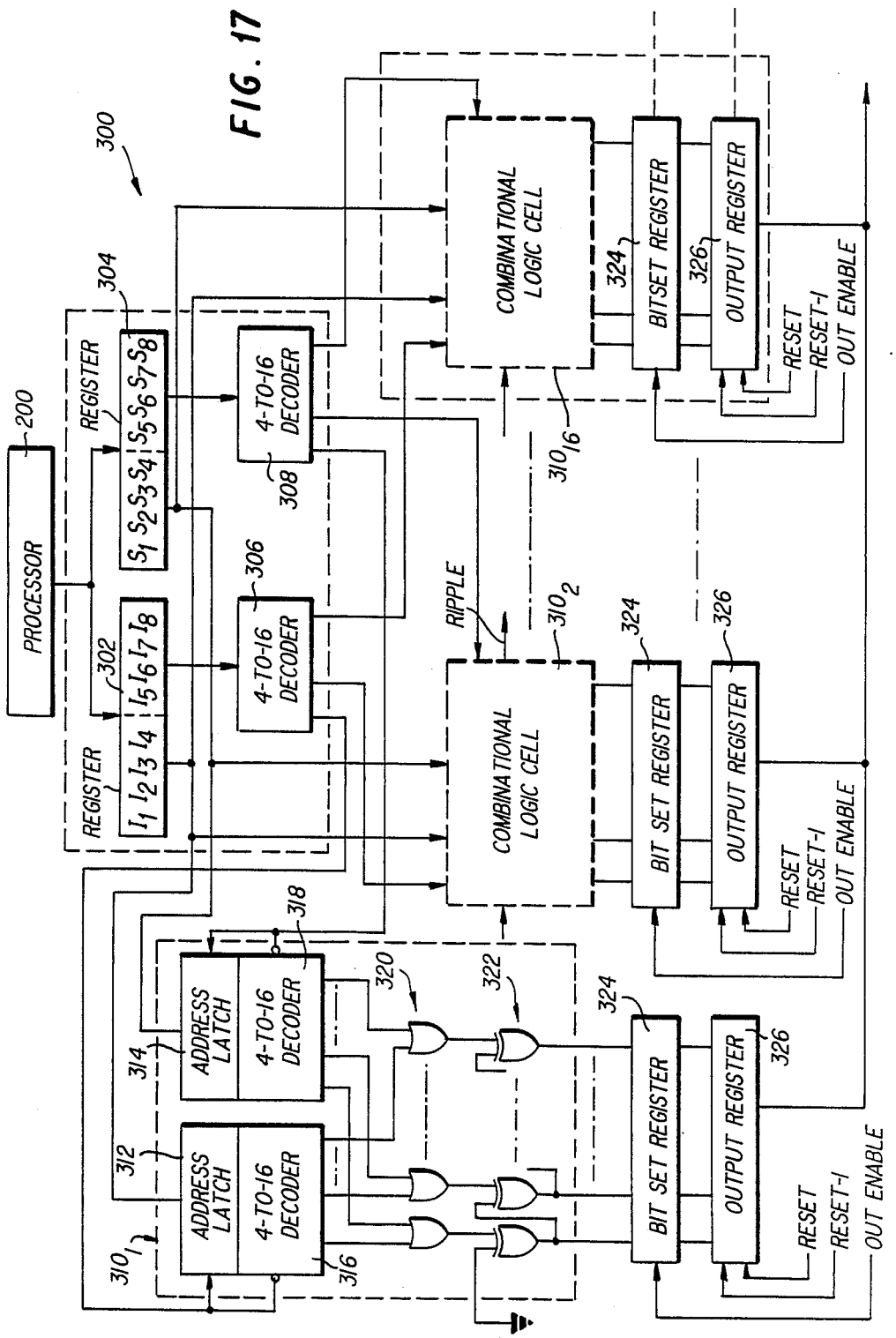

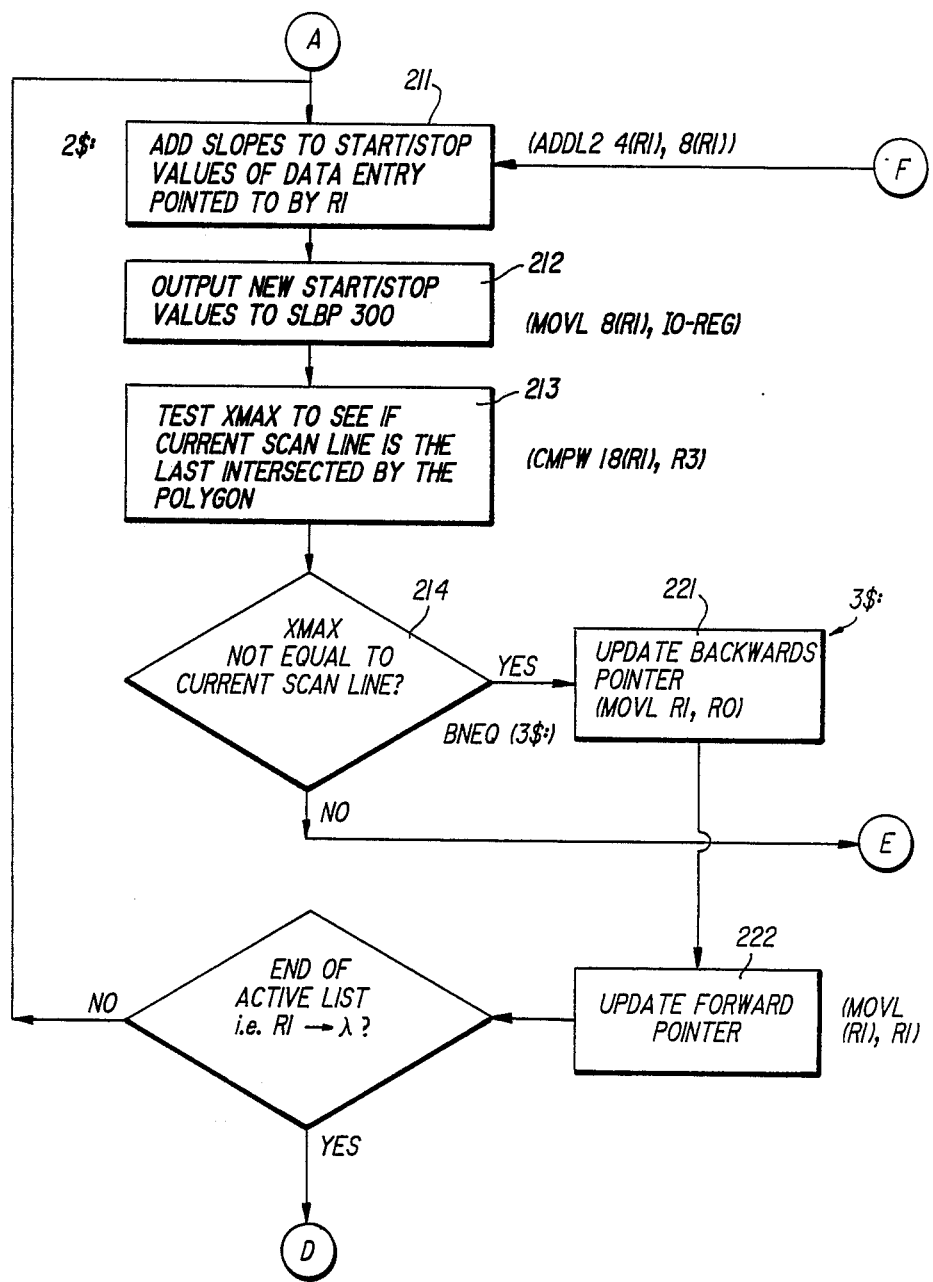
FIG. 20B₁

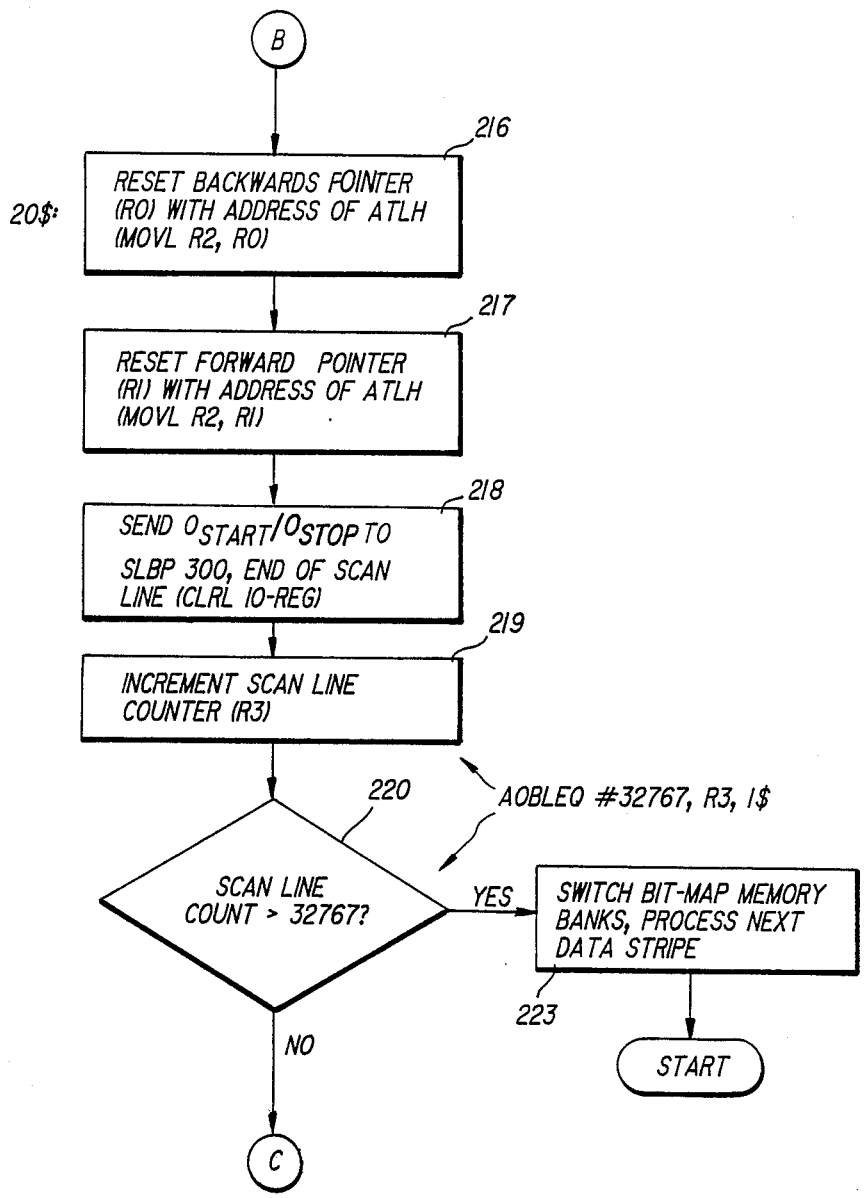
FIG. 20B₂

RASTERIZATION SYSTEM FOR CONVERTING POLYGONAL PATTERN DATA INTO A BIT-MAP

BACKGROUND OF THE INVENTION

1. Field of the Invention

This invention relates to two-dimensional rasterization systems, particularly as applied to E-beam lithography, used to produce masks for integrated circuit-fabrication or to directly expose a silicon wafer.

2. Discussion of Background

E-beam lithography systems are used in the manufacturing of integrated circuits. These systems accept pattern data from a magnetic disk or tape and form images from that information by selectively exposing, with a finely focused electron beam, an electron-sensitive resist material covering the substrate. After exposure, the substrate is removed from the system and is developed by an etching process. The resolution of the E-beam system defines the smallest feature that can be formed and, therefore, affects the scale of integration that the system is capable of supporting.

A raster scanning scheme is used to write a pattern with the E-beam. The beam scans in one axis over the area to be exposed. Motion in the other, perpendicular, axis is achieved by moving the substrate. FIG. 1 illustrates the raster-scan routine. Sweeping the beam over the substrate in a series of parallel stripes is one aspect of the basic writing scheme.

Another aspect is the problem of switching the beam on and off in the appropriate places as it sweeps in order to obtain the exposure contrast between the pattern features and the background. This can be envisioned as if a stripe that is written is presented as a dot matrix or grid in which the pattern features are formed when positions in the grid are exposed by the beam and the background then becomes all of the positions that are left unexposed. This is illustrated in FIG. 1. Each grid position is called an address, and the spot size (i.e., the diameter of the beam at the writing surface) is equal to the address size, which is the length of one side of the address (addresses are square). The beam is driven by the bit-map of the pattern which is a binary numerical representation of a stripe to be written. For each address in the stripe there is a bit position in the bit-map. If the bit position holds a 1, the address is exposed, while it is left unexposed if the bit position holds a 0. FIG. 2 illustrates the bit-map correspondence of a pattern feature.

In preparation for writing a stripe, the E-beam system extracts from the pattern data the information for the stripe and constructs the bit-map. The stripe data is a collection of Electron Beam Exposure System (EBES) figures. FIG. 3 illustrates the repertoire of EBES figures. In standard EBES format, there is a figure entry every time a figure appears in a stripe, while in extended EBES format, figures are repeated many times and there is only one figure entry which includes the repetition factor and the interval of repetition. The extended EBES format offers a dramatic compression of the input data thus making possible the writing of very large scale integrated circuits.

When an E-beam system is used commercially for fabrication of masks and reticles, a performance parameter of major importance is throughput in terms of masks or reticles produced per unit time. This performance parameter is directly affected by the time the system requires to convert pattern data into a bit-map.

Currently there are no E-beam systems capable of writing reticles in real time, i.e., converting pattern data into a bit-map as fast as the beam scans a stripe driven by the bit-map. The lack of real-time writing results in high data handling overhead and low system throughput because exposure and bit-map conversion are sequential processes. Overhead times of 16 to 1 have been reported for E-beam systems currently operating in the field. This overhead is expected to dramatically increase as design of larger scale integrated circuits evolves. An attempt to decrease the bit-map conversion of pattern data by restricting the input data only to rectangles or EBES figures with 45° angles offers some improvement but is viewed as highly undesirable.

Existing pattern data handling systems employed by E-beam systems operating in the field rely on a special purpose uniprocessor to perform the pattern data to bit-map conversion. FIG. 4 illustrates the block diagram of the subsystem that performs the pattern data handling. Pattern data stored on a tape 1 are converted to appropriate data format by host computer 2. A bit pattern to be exposed is stored in a disk 1 in the form of segment stripe data. Each segment stripe contains figure data in EBES format. The figures in a segment stripe are randomly placed, and the address of their left most corner indicates their location in the segment stripe. Data contained in a segment stripe is transferred from the disk via the host computer 2 to the pattern memory 4. The special purpose processor 5 accesses data from the pattern memory, one figure at a time, converts it to bit-map form and writes it into the bit-map memory 6.

The conversion of the EBES figures into bit-map representation is based on a polygon rasterization algorithm which is very inefficient when the figures are trapezoids and also requires a read-modify-write operation when the converted figure is stored in the bit-map memory. This is a very time consuming operation which adversely affects the processor throughput as will be shown shortly. After all the figures in the segment stripe have been processed, the host computer 2 initiates the data transfer from the bit-map memory 4 to the blanking register 7 and consequently to the beam. The data transfer to the register 7 takes place under the control of the special purpose processor 5, and it occurs on a word (i.e., 16-bits) by word basis while the output of the blanking register is a single bit at a time. During writing (i.e., loading the blanking register 7 with bit-map data), the special purpose processor 5 does not process data from another segment stripe. The beam is forced to an idle state as soon as the current segment stripe has been exposed and remains idle for as long as it takes the special purpose processor 5 to produce the bit-map of the next segment stripe. The sequencing of these events is a source of time overhead that has a negative impact on performance of the E-beam system in terms of throughput An example illustrating the writing procedure of a single pattern and of an array of identical patterns is shown in FIGS. 5-8. The E-beam scanning is synchronized with the moving stage that holds the substrate. In the case of a single pattern, when writing of one segment stripe is complete, the motion of the stage is reversed and the next segment stripe is written in the opposite direction (FIG. 5) when the bit-map data becomes available. In the case of an array of identical patterns, the first segment stripe is written into all the array elements before the computation of the next segment stripe begins. The writing of a segment stripe of alternate rows of the array occurs in opposite directions as shown in FIGS. 6-8. This system takes advantage of the identical patterns in the array to reduce the ratio of figure to bit-map conversion time versus writing time, since the bit-map of a segment stripe is computed once and is then written into all the array elements. The system's performance, even in this case, is far from approaching real-time writing, and it is further linearly deteriorated in case the patterns in the array are not identical, which is often the case.

U.S. Pat. No. 4,433,384 to Berrian et al discloses a pattern data handling system for an electron beam exposure system. Berrian et al attempt to obtain writing and concurrent data conversion using a five processor system to perform the figure to bit-map conversion. In the Berrian et al system, the pattern conversion is performed by four processors with their own bit-map memory while the fifth is managing the data transfer from four bit-map memories to the shift register that drives the beam blanker. The overall architecture is, in principal, the same as in the case of a uniprocessor, the only difference being the four copies of the uniprocessor which perform in parallel. Figures are converted using the polygon writing algorithm, as in the uniprocessor case, and the data handled is standard EBES only (i.e., no figure repetition is allowed). When figures are converted to a bit-map, the bit-map has to be stored in memory through a read-modify-write operation. The segment stripes handled by this system are 1024 bits by 244 bits, and the maximum number of figures the system can handle is 50,000.

Although the Berrian et al system configuration offers some throughput improvements compared to the uniprocessor system, it also has some distinct disadvantages. All four processors access the same pattern memory which implies the existence of memory dependencies. That is, a memory request cannot be served before the request currently under service is completed. The pattern memory is a single port memory and it cannot be filled with new stripe data while the current stripe data is being processed, thus lowering the overall system throughput. The involvement of the Nova-4 Data General computer in controlling the bit-map transfer to the blanking circuits and its handshaking with the four processors adversely affects the system performance due to the differential in speed between the Nova-4 and the AMD2901. Finally, the amount of data this configuration can process on per stripe basis is significantly lower than the amount of data encountered in today's very large scale integrated circuits (VLSI), and therefore, the system can only be used if the data structures are modified (i.e., segment stripes are divided in smaller entities), which poses serious complications for other parts of the E-beam data handling system.

Other U.S. patents of interest are U.S. Pat. Nos. 3,900,737; 4,145,597; 4,147,937; 4,258,265; 4,259,724; 4,267,456; 4,280,186; 4,291,231; 4,387,433; 4,433,384; 4,445,039; 4,477,729; 4,489,241; 4,498,010; 4,511,980; 4,532,598; and 4,538,232.

SUMMARY OF THE INVENTION

Accordingly, it is an object of this invention to provide a novel rasterization system, particularly but not exclusively having application to E-beam lithography, capable of converting polygonal pattern data to a corresponding bit-map and providing the bit-map data in real time, for example to an E-beam such that the time for writing of a mask or reticle is no longer than the time required for the beam to scan over the mask or reticle.

Another object of this invention is to provide a novel rasterization system based on a scan-line algorithm that supports both standard and extended EBES data formats where the EBES figures have arbitrary angles.

Yet another object of this invention is to provide a new and improved rasterization system that can sustain real-time performance for patterns containing $10^6$ figures per stripe, far beyond what are today's technological capabilities for design and fabrication of integrated circuits.

Still another object of this invention is to provide a rasterization system, as above described, with modular architecture and organization so it can be easily upgraded to handle even higher data volumes without the need for redesign.

Yet another object of this invention is to provide a novel rasterization system, as above described, which results in high noise performance of the bit-map signal that actually controls the beam blanking circuit. This significantly increases the accuracy of the written pattern.

These and other objects of this invention are achieved according to the invention by providing a novel rasterization system for converting polygonal pattern data into a bit-map for real time writing of masks and reticles with an E-beam system. In addition, the system according to the invention provides other features desired in fabricating reticles, such as tone reversal, mirror writing, multiple scans, serpentine writing and writing of partial stripes. The system converts input data on a per segment stripe basis which is the area that the beam exposes during each increment of the writing process. Many abutting segment stripes form a segment or a pattern. A segment or a pattern is written without pausing the beam or stage movement at any time. Therefore, data conversion to a bit-map and actual writing are performed concurrently. The system also provides the resources and the intelligence to access data on the magnetic disk of the E-beam system, transfer them to its local memory structure, convert them to a bit-map, store the bit-map into its bit-map memory structure, and finally, provide the circuitry that turns on and off the beam with bit-map data through a fiber optic link that operates at the beam blanking frequency of 80 MHz. This improves dramatically the performance of the beam blanker since the fiber link is immune to digital noise, thus increasing the reliability of the written pattern.

More particularly, the present invention is directed to provide a new and improved rasterization system for converting plural polygonal pattern data each defining the shape and location of a respective polygon in a two-dimensional field into respective bits of a two-dimensional bit-map, wherein the respective bits of the bit-map and the locations thereof within the bit-map correspond to the shapes and locations of the polygons in the two-dimensional field and wherein the bit-map is divided into plural data stripes, each data stripe including plural scan lines, each scan line including plural bits. The rasterization system includes means for converting the plural pattern data of a data stripe into plural respective linked data entries such that data entries which correspond to polygons intersecting the same scan line are sequentially linked from one data entry to a next data entry; first memory means for storing the plural linked data entries; processor means coupled to the first memory means for receiving the plural linked data entries from the first memory means and processing the received linked data entries by determining for each scan line the bits thereof intersected by each polygon represented by the respective linked data entries, the processor means setting each bit so determined to a predetermined logic state and producing bit-map data corresponding to the set bits; second memory means coupled to the processor means for storing the bit-map data for each scan line of the data stripe, whereby the two-dimensional bit-map of the plural polygonal pattern data corresponding to the data stripe is formed and stored in the second memory means; and means for reading out sequentially the bit-map data stored in the second memory means.

Further according to the invention, the first memory means includes first and second double buffer memories interconnected such that one of the double buffer memories outputs to the processor means data entries corresponding to a first data stripe while the other of the double buffer memories receives and stores data entries corresponding to a second data stripe from the converting means. The second memory means then includes third and fourth double buffer memories interconnected such that bit-map data corresponding to the first data stripe is being loaded into one of the third and fourth double buffer memories from the processor means while bit-map data corresponding to a third data stripe is being read out from the other of the third and fourth double buffer memories.

In a preferred embodiment, the first through fourth memories, the processor means and the reading out means in combination form a data stripe processing module, and the rasterization system of the invention includes plural of the data stripe processing modules for simultaneously processing respective data stripes corresponding to adjacent portions of said bit-map, and second control means for controlling the reading out means of each of the modules so that the plural modules output a continuous series of bits of said bit-map spanning the plural data stripes.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings wherein like reference numerals designate identical or corresponding parts throughout the several views, wherein:

FIG. 10 is an illustration table structure of an example of sorted data entries undergoing processing during production of a bit-map according to the invention;

FIGS. 17 and 18 are circuit diagrams illustrating the structure of the scan line bit producer according to the invention;

FIGS. 20A, 20B and 20C in combination are a flow chart illustrating the processing steps of the processor according to the inventions.

DESCRIPTION OF THE PREFERRED EMBODIMENTS DETAILED

Figure 1:
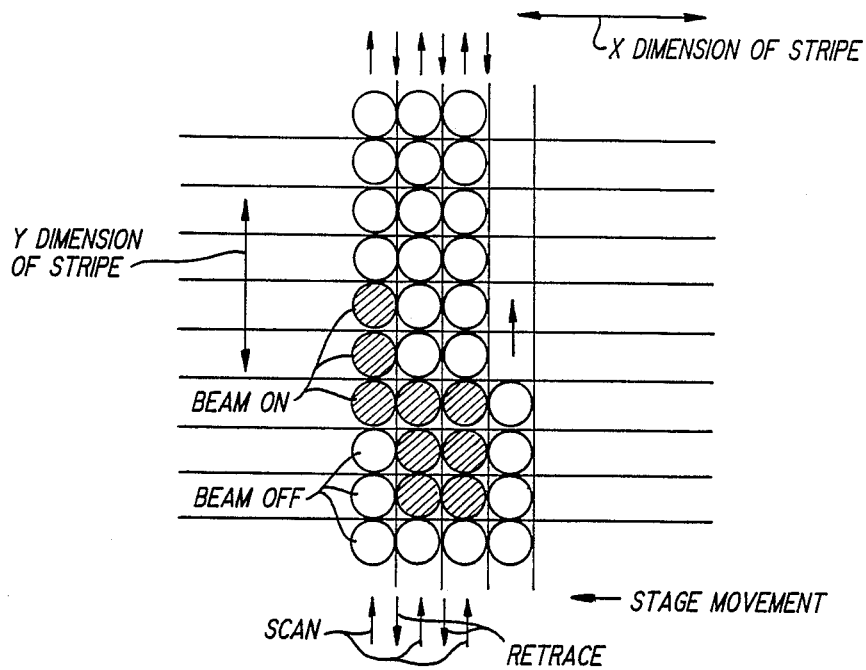
FIG. 1 is diagram illustrating bit-map rasterization in the context of electron beam scanning.
Figure 2:
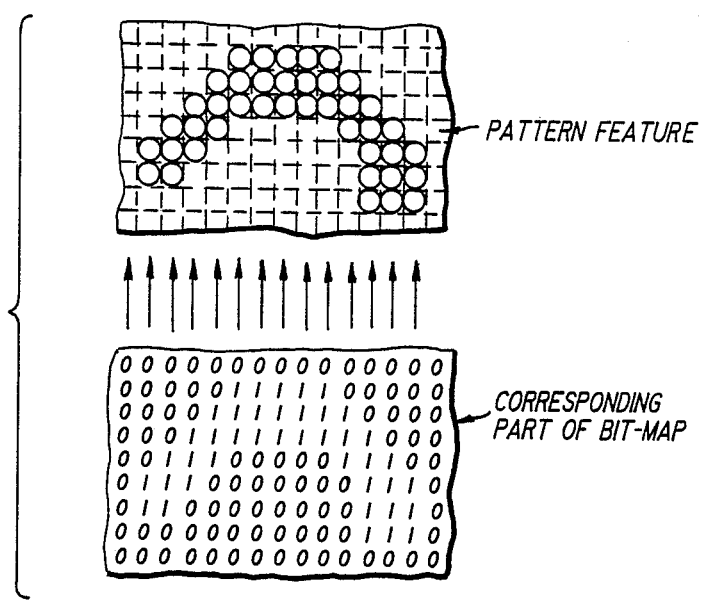
FIG. 2 is an illustration of the correspondence between pattern features and a bit-map.
Figure 3:
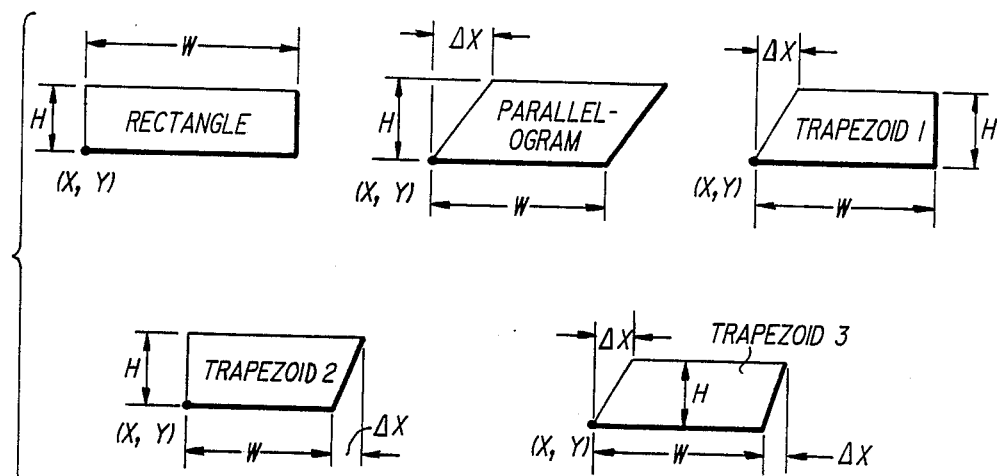
FIG. 3 is an illustration of various EBES figures.
Figure 4:
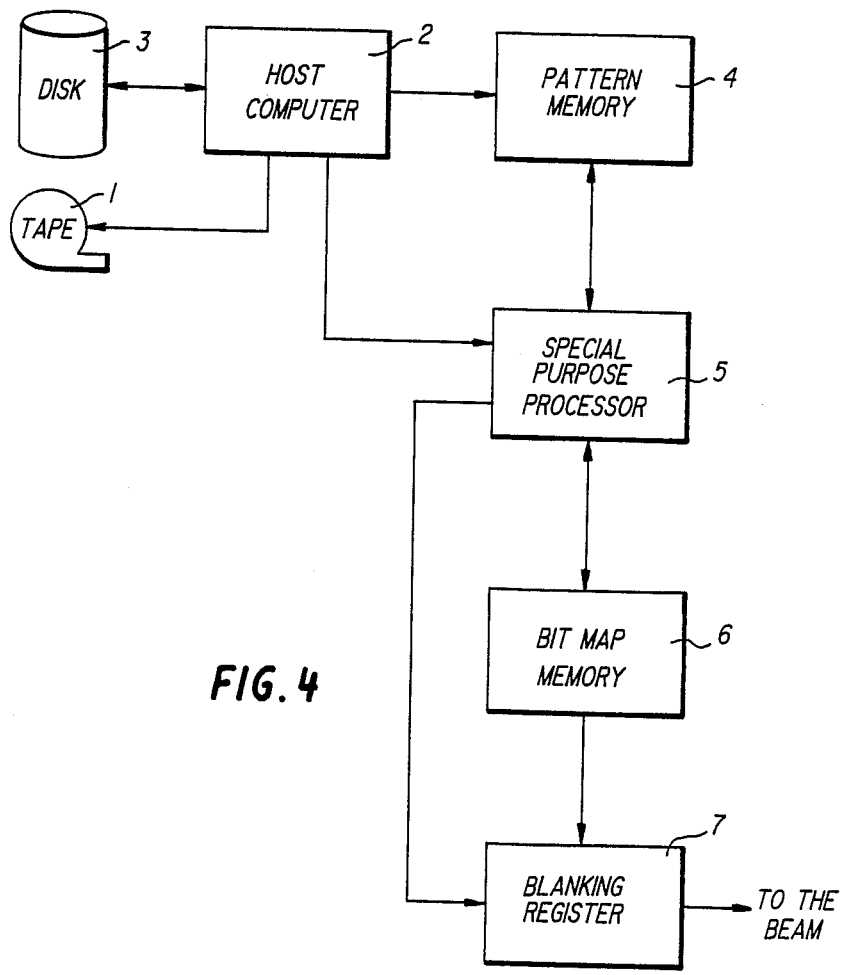
FIG. 4 is a block diagram of a conventional uniprocessor system for pattern data processing.
Figure 5:
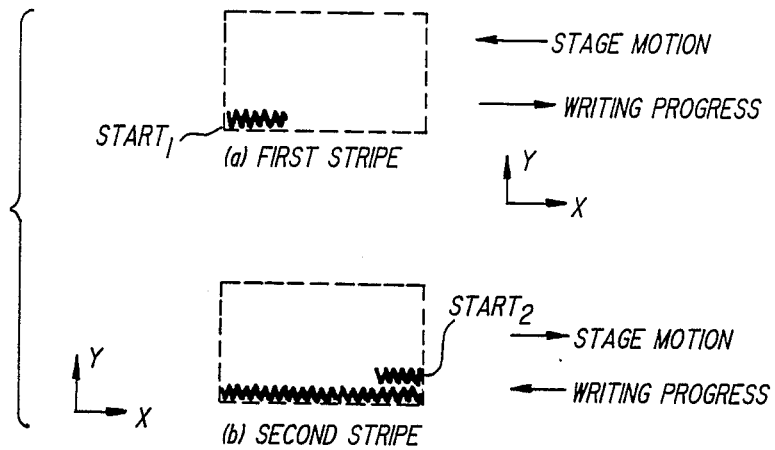
FIG. 5 is an illustration of serpentine writing of a data segment.
Figure 6:
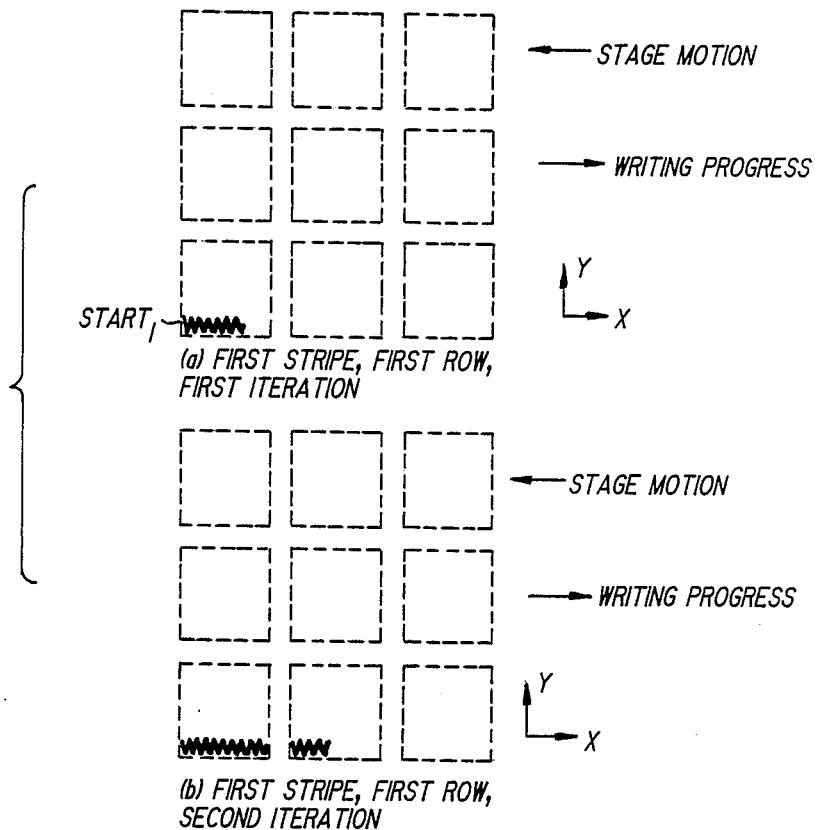
FIGS. 6-8 are illustrations of serpentine writing of an array of patterns.
Figures 7, 8:
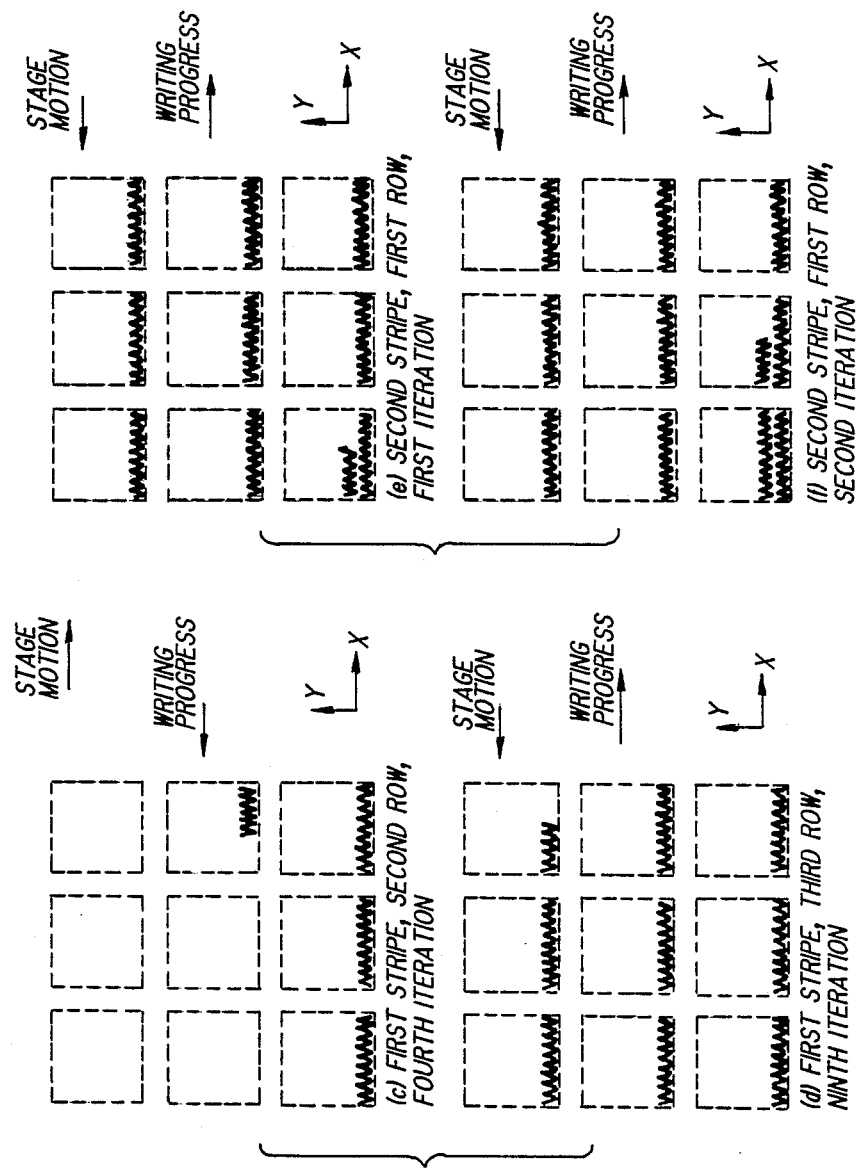

Before discussing in detail the structure of the rasterization system according to the invention, the following description of different rasterization techniques is helpful to an understanding of the invention.

The essential function to be performed by the E-beam data processor is the conversion of polygon descriptions, in EBES format, into a raster data bit-map, one bit deep, compatible with electron beam writing. The basic problem of polygon rasterization (i.e., filling) is one with a considerable history in the computer graphics literature. Over the years two approaches have emerged as solutions: scan-line writing as performed according to the invention and polygon writing. (By way of background, see J. D. Foley and A. Van Dam, *Fundamentals of Interactive Computer Graphics*, Addison-Wesley (1982); and W. M. Newman and R. F. Sproull, *Principles of Interactive Computer Graphics*, McGraw-Hill (1979).)

Polygon writing works by taking each polygon description, one at a time, out of a list and calculating which bits in the raster memory are enclosed by the boundaries of the given polygon. These bits are then set to the appropriate value. The initialization of all of memory is required to remove old data. Usually the bits to be set will not always fall on convenient word boundaries. Some bits in a word will need to be set while others should be left at their old values (either set or clear). As a result of this situation, the writing of any memory word must be of the form read-modify-write. This type of memory reference will usually take between 50 and 100% longer than a simple write to memory. In the case where the polygons are all rectangular, special hardware can fill a polygon with just a few machine instructions, since from one word to the next the write mask will not need to be changed. But filling irregular polygons will take considerably longer than rectangles with a polygon writing algorithm.

In scan-line writing, one scan-line at a time is processed rather than one polygon at a time. One using this approach keeps track of which polygons are intersected by the current scan-line and calculates the starting point and length of the line segment created by the intersection of each polygon and the current scan-line. The conventional scan-line writing algorithm keeps track of all polygon edges as separate entities. As a result it can deal with polygons with any number of edges and with vertices at any angles. The major drawback to this versatility is the requirement to sort edges in the X and Y dimensions and, if there is polygon overlap, in a third dimension as well. This sorting can be very time consuming, and in the case of overlap has to be checked during every scan-line since the order of the edges can change.

There are three distinct advantages to scan-line writing. First, by using a register the size of the scan-line, the bit-map memory does not need to be initialized, only the scan-line register. This register can be cleared in a single clock period. Second, the contents of this register can be written to the bit-map with only a write cycle, not the longer read-modify-write cycle of the polygon writing algorithm. Third, the setting of bits in the register can be separated (pipelined) from the calculation of which bits to set. In this way two time consuming processes can be executed in parallel. The pipelining requires the communication of only the short start and stop addresses of the segment of bits to be set. Pipelining bit setting with a polygon writing algorithm would require the communication of a mask and an address. In the case of a large bit-map, such as the one used for E-beam writing, the address and mask would require several words to be communicated, producing little, if any speed-up.

The disadvantages of the conventional scan-line algorithm—sorting in three dimensions and one data entry per polygon edge—can be eliminated if the polygon data is restricted to a certain class of shapes. According to the invention, two polygon edges are parallel to each other and the scan-line axis, such that these two edges can then be ignored. There are only then two more edges (for a total of four) and all of the information necessary to describe the polygon is contained in these remaining two edges. A triangle with one edge parallel to the scan axis is a special case in this class. Consider that it is a four edged polygon with one of its parallel edges having a length of one address unit. EBES figures almost meet this criteria. They have four edges with two of them always parallel. The algorithm of the invention is at least an order of magnitude faster than the standard scan-line algorithm, due to the lack of a three-dimensional sort. It is also at least three times as fast as a polygon fill algorithm, thanks to the pipelining, lack of memory initialization, avoidance of word boundary problems, and no read-modify-write cycles.

Figure 9:
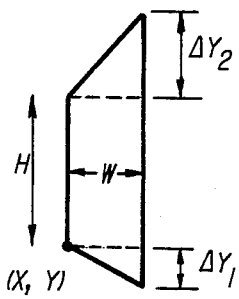
FIG. 9 is an illustration of a data entry format explaining the plural data fields of a data entry and the correspondence thereof to a respective polygon.

In order for the scan-line algorithm according to the invention to run as fast as possible, it must refer to polygons in a somewhat different format than EBES, and the polygons must be sorted by their minimum X value. FIG. 9 illustrates an efficient data structure. It is based on a 32 bit word length in order to provide maximum memory throughput and the necessary pointer addressing capability. Instead of containing delta Y values the slopes of the two edges of interest are calculated as indicated. FIG. 9 also shows the calculations for original start and stop values and the XMAX value.

Figure 11:
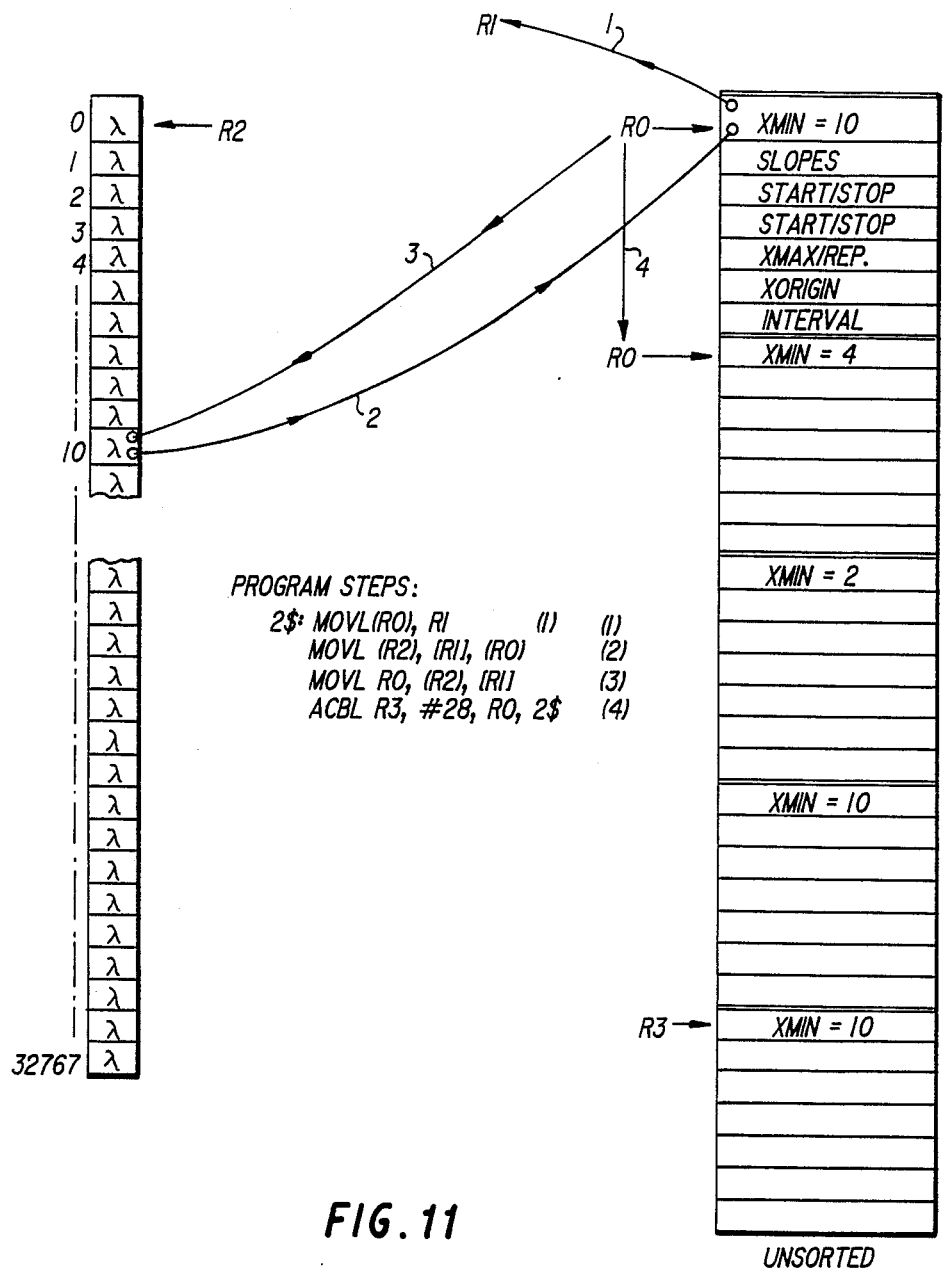
FIGS. 11 and 12 are illustrations of the data entry sorting performed in producing a static table according to the invention.

In its unsorted state the table format of FIG. 9 contains each figure's minimum value in X as the first 32 bit word (POINTER or XMIN Field) in each feature's entry. The whole group of features is sorted on these values into 32768 buckets, i.e., the number of scan-lines or possible X values. Each bucket holds a linked list of entries. The entries within the linked lists are not sorted providing a considerable time savings. See FIG. 10. The bucket sort is linear in time and directly proportional to the number of polygons to be sorted. The initial sorting step is illustrated in FIG. 11 using the VAX instruction set, as next described.

Figure 12:
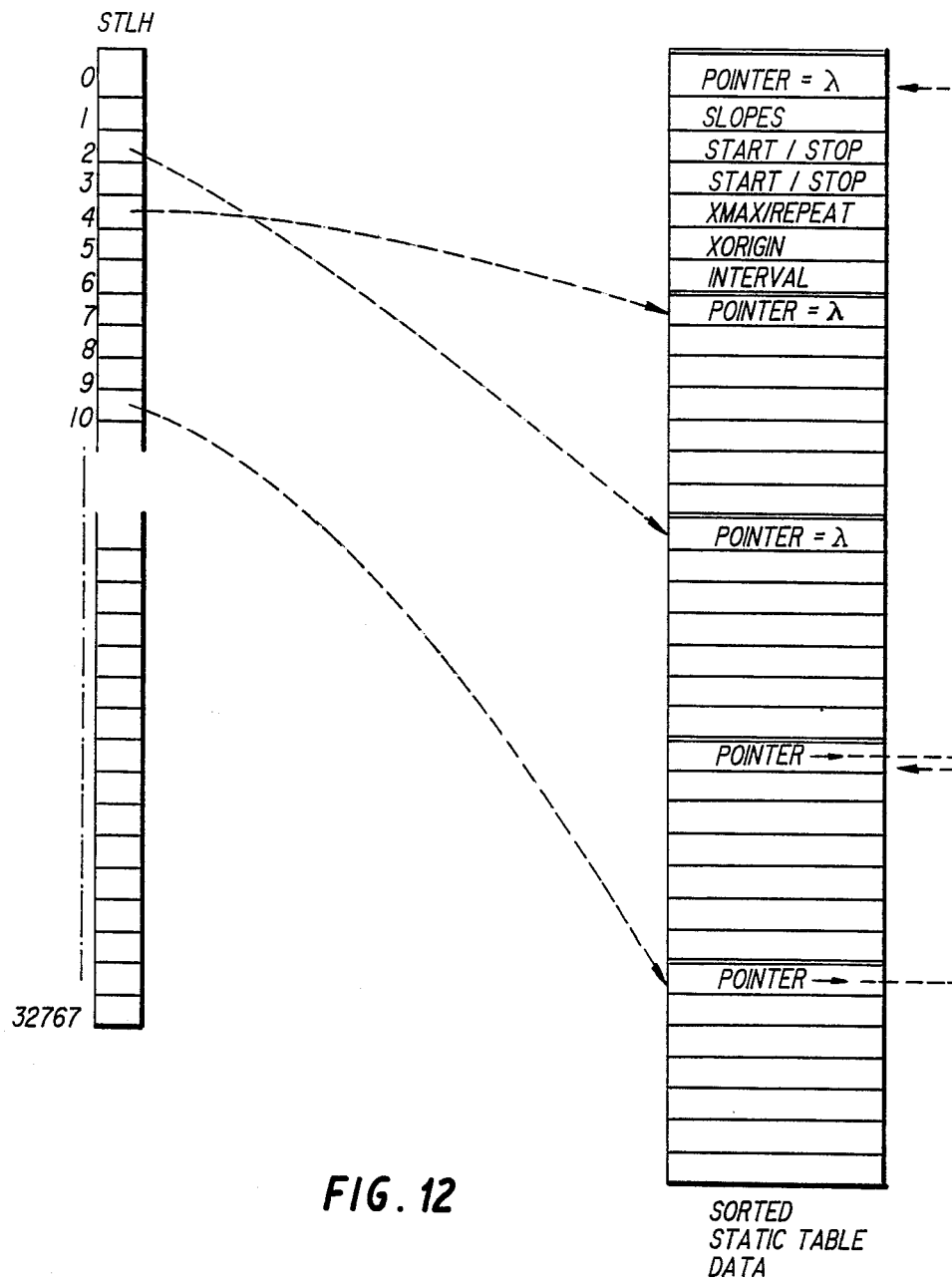

The unsorted table data resides in contiguous words of memory. The address of the head of this memory block is contained in register R0 and the address of the end of this block is contained in register R3. A contiguous static table list head is located elsewhere in memory. It initially contains all lambdas (i.e., zeros). Its address is contained in register R2. After once initializing these three registers, the algorithm requires only four instructions per polygon. Instruction 1 moves the XMIN value (the sort key) into register R1. This value is used in instruction 2 as an index into the table list head. The list head value is moved to where XMIN used to be. Then in instruction 3 the address of the polygon entry (currently stored in register R0) is moved to the list head location. Finally 28 (the number of bytes in a table entry) is added to R0, it is tested with R3 and if the sum is less than or equal to R3 a branch is taken back to instruction 1. FIG. 11 illustrates the four instruction sequence for the first polygonal data entry, and FIG. 12 illustrates how the sorted static table is created for three buckets filled with the five polygon entries shown in FIG. 11. There is one polygon in bucket 2, one polygon in bucket 4, and three polygons in bucket 10. The latter three polygons ar connected in a linked list. Note that lambda signifies the end of a list.

Figure 13:
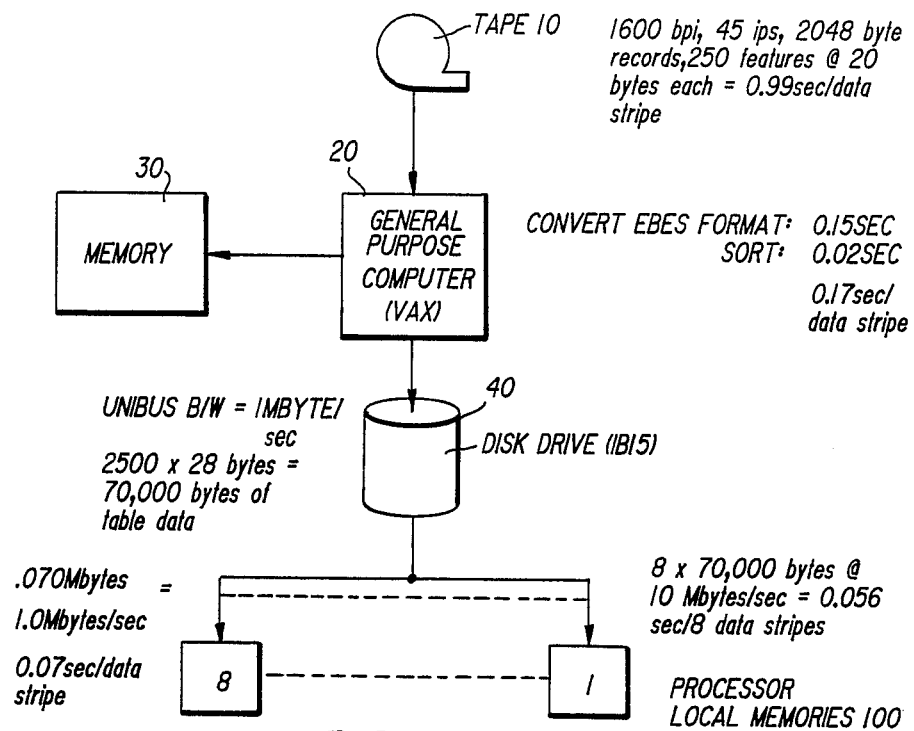
FIG. 13 is a block diagram of hardware for producing a static table according to the invention.

The inventors have written a software module which produces an EBES data stripe (i.e., one-eighth of a segment stripe) with 3520 extended features, all with a repeat count of 32. This is equivalent to 112640 standard features. 27% of the features are of trapezoid-3 type and the rest are rectangles. Another module converts the EBES data (with properly oriented features) into our table format. This conversion takes approximately 60 microseconds per extended feature on an unloaded VAX 11/780. Sorting takes another 8.5 microseconds per extended feature. The equivalent time for 2500 extended features (a typical limit for high density reticles) would be: conversion to table format in 150 milliseconds and sorting in 20 milliseconds. These times are illustrated in FIG. 13 along with the estimated time to read a data stripe off a moderate disk drive. Data files stored in the disk drive have been converted to appropriate table format and sorted. These data are ready to be transferred to the processing and memory circuits for high speed conversion into bit-map data.

FIG. 13 is a block diagram of data flow from an EBES tape 10, which stores EBES polygonal pattern data having properly oriented features, as above described. Tape 10 feeds a general purpose (e.g., VAX) computer 20, having associated memory 30, which in combination convert the polygonal pattern data to table formats suitable for processing according to the invention and performing sorting to derive the static table of pattern data entries. Computer 30 feeds a high speed disk drive 40, e.g., an IBIS, which stores sorted data for high speed application to processor local memories 100 ($RAM_{11}$-$RAM_{ij}$), described in more detail hereinafter.

According to the invention, data format conversion and loading of the disk drive 40 can be performed off-line. Further, depending upon the quantity of the data converted and sorted, and the actual speed of the hardware selected (the VAX and IBIS selections are examples, and in fact faster hardware is currently available) plural disk drives can be connected in a double buffer configuration to drive the local memories 100. As above shown, it is envisioned that format conversion and sorting is performed by the computer 20. However, this could also be done elsewhere and converted sorted pattern data could be applied directly to the disk drive 40.

Figure 14:
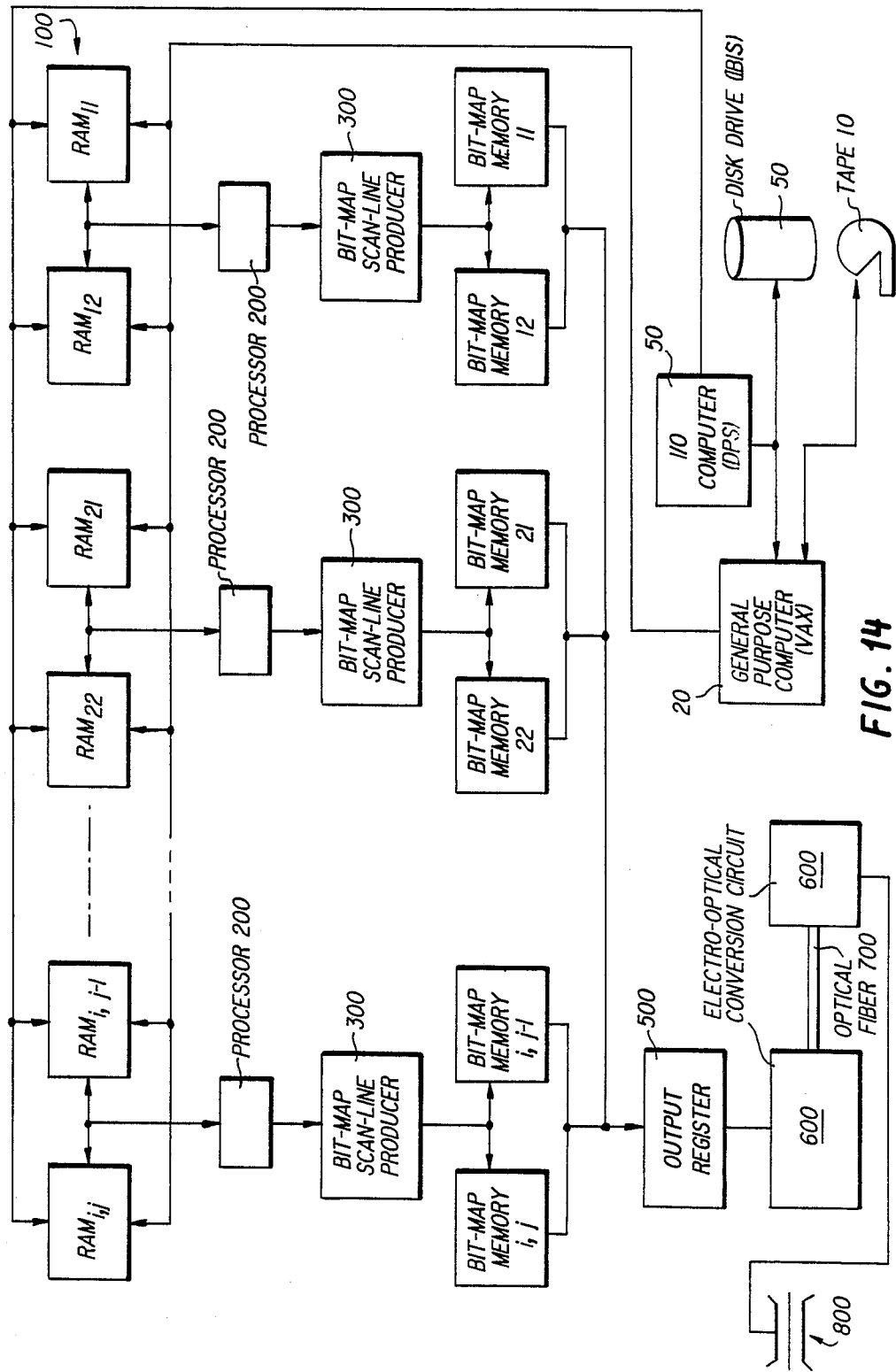
FIGS. 14 and 15 are block diagrams illustrating the architecture of the rasterization system for producing a bit-map based on a static table according to the invention.

FIG. 14 is a block diagram of the figure conversion parallel processor hardware for actually converting sorted data stored in the disk drive 40 to bit-map data according to the invention.

The figure conversion hardware is configured as a multi-tasking parallel processor system. That is, all the processors 200 in the system perform the same computations on different data sets without the requirement of interprocessor communication during processing. The parallel processing configuration includes eight processors 200 (i=1-8), each operating on one-eighth of a segment stripe defined as a data strip. Each processor has two banks of local memory 100 ($RAM_{11}$, $RAM_{12}$; $RAM_{21}$, $RAM_{22}$; ... $RAM_{i1}$, $RAM_{ij}$, respectively), where the converted sorted input data describing EBES figures are stored. Each memory bank can store data from one data stripe. The processors utilize a novel scan-line algorithm according to the invention to produce run length encoded messages that are utilized, by custom designed circuits, for the bit-map transformation of data stripes, one-eighth scan-line (i.e., 256 bits) at a time, per processor 200. The bit-map representation of each data-stripe is stored in a respective bit-map memory $400_{ij}$. There are two banks of bit-map memory 400ij associated with ever processor, each capable of storing the bit-map of a data stripe. The data from the eight bit-map memories $400_{ij}$ are transferred to an output register 500 that drives the E-beam as 32-bit words through a 32-bit bus under the control of a direct memory access (DMA) circuit (not shown). The register outputs one-bit at a time at 80 MHz rate. This output is received by an electrical-to-optical conversion circuit 600 which propagates it through a fiber optic link 700 that provides the inputs to the E-beam blanking circuitry 800. The fiber line is terminated with an optical-to-electrical converter (not shown) which is mounted on the column containing the E-beam source and provides the blanking signal that controls the exposure of the pattern.

The data-stripes processed at any given time belong to the same segment-stripe. The data-stripe input data is provided from a high-speed disc 400 (e.g., IBIS-1400, 10 MB/sec transfer rate, 1.2 GB capacity) under the control of a host computer (VAX-750), and it is stored in the local memory of the processor. The data tranfer from the disc to the processors is the only sequential operation occurring during the writing of patterns or reticles.

FIG. 14 also illustrates the connection of the figure conversion parallel processor hardware to the E-beam's host computer 20. In FIG. 14 a fast I/O computer 50 (e.g., APTEC DPS-2400) is provided to facilitate data transfers from the disk 40 at 10 MB/sec. By way of example, the local memories (i.e., $RAM_{ij}$, j=1,2; i=1,8) are, e.g., 256 KB, each board populated, e.g., with Motorola's MCM6168 static RAM chips. The MCM6168 is a 16K SRAM with 45 nsec access time. The processors 200 are, e.g., 32-bit microcoded processors manufactured by American Micro Devices. This processor, AM29332, has a 90 nsec instruction cycle and three I/O buses. The bit-map memories are, e.g., 1 MB dynamic memory boards available by Elite Computer Systems. The E82/RAM2 boards are, e.g., populated with 256K RAM chips, have access time of 400 nsec (32 bits), and they provide on board refresh cycles for the memory. The fiber optic link 700 and its associated transmitter/receiver module pair 600 are, e.g., Sumitomo's DM-54 system with transfer rate of 125 Mb/sec.

Figure 15:
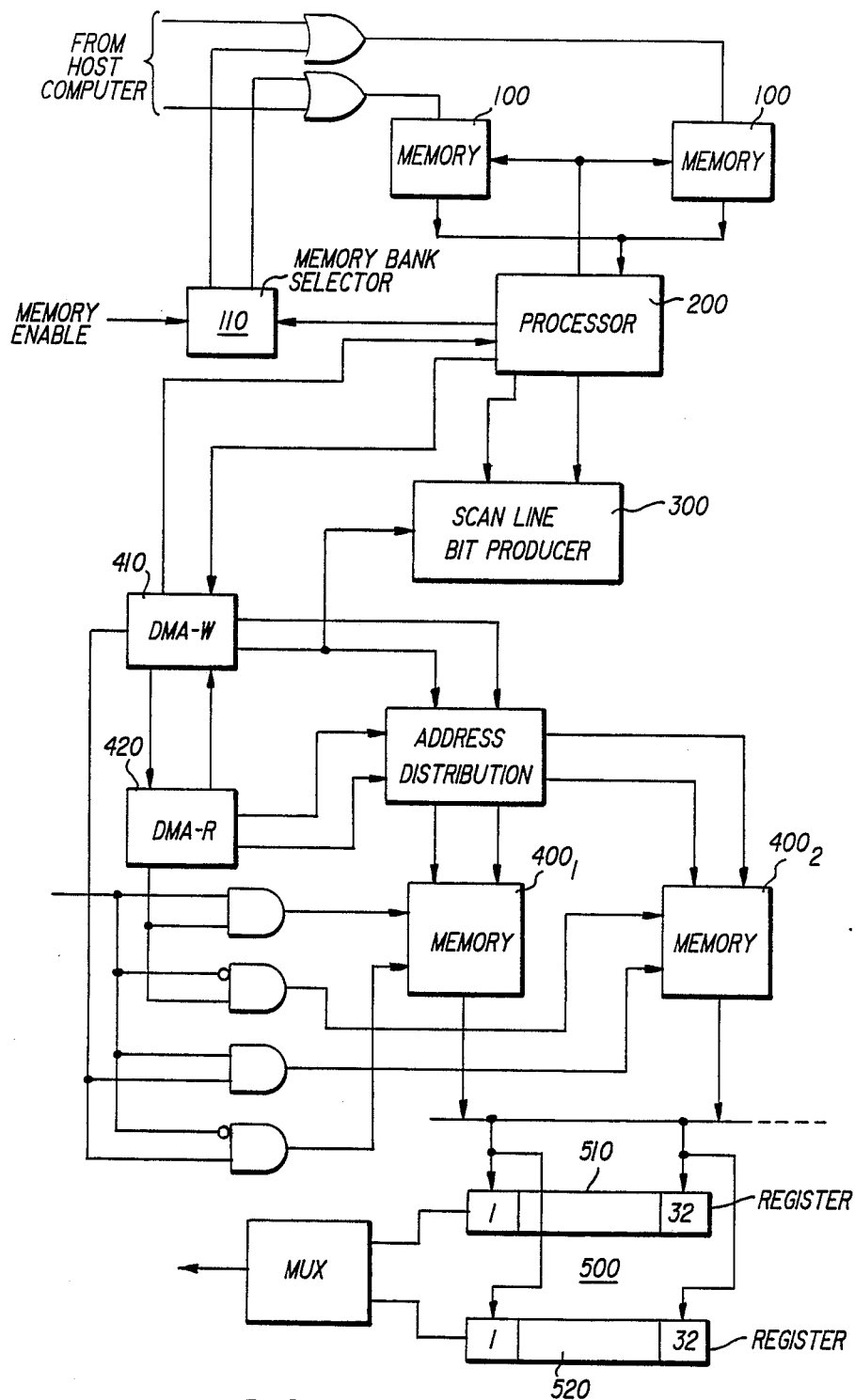

The processors 200 in the bit-map generation system operate independently performing identical computations. Therefore, the bit-map generation of a segment-stripe will be discussed by considering the kernel (⅛th) of the multiprocessor system. FIG. 15 illustrates one processor and its support hardware required for the bit-map generation of a data-stripe.

Figure 16:
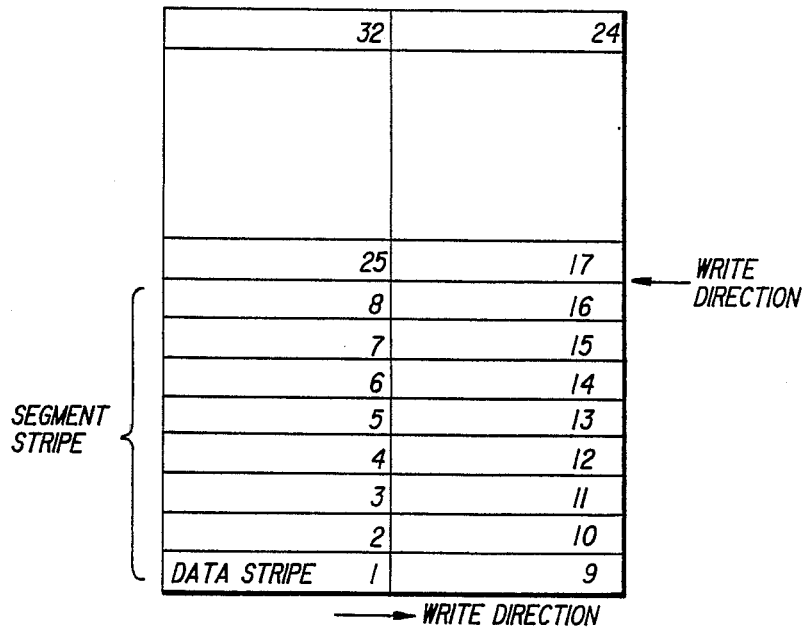
FIG. 16 is an illustration of a segment stripe pattern which can be processed in real time according to the invention.

The host computer initially loads a data-stripe to each of the DATA-RAMS associated with the processor. The two data-stripes belong to two consecutive segment stripes (along the writing coordinate), and they have the same order within the segment-stripes. For example, if the processor 200 in FIG. 15 is designated processor-1 and the pattern to be written is the one shown in FIG. 16, the DATA-RAMS 100 will be loaded with data-stripes 1 and 9. If the pattern was 1×2 segment-stripes, then the DATA-RAMS 100 would have been loaded with data-stripes 1 and 25.

The processor 200 accesses first the DATA-RAM 100 containing data-stripe 1 and performs the computations involved in the scan line algorithm of the invention, described hereinafter. Although the processor 200 addresses the DATA-RAMS 100 via an address bus, only one memory is enabled to READ or WRITE. The control for this operation is provided by the memory bank selector 110 and can be administered either by the processor itself or by the host computer. Thus, the invention employs a double buffer input memory configuration in which data for one data stripe is being read into one of the DATA-RAMS associated with processor 200 while the other of the DATA-RAMS outputs data to the processor 200 for bit-map conversion, i.e., of that portion of the scan line.

Figure 18:
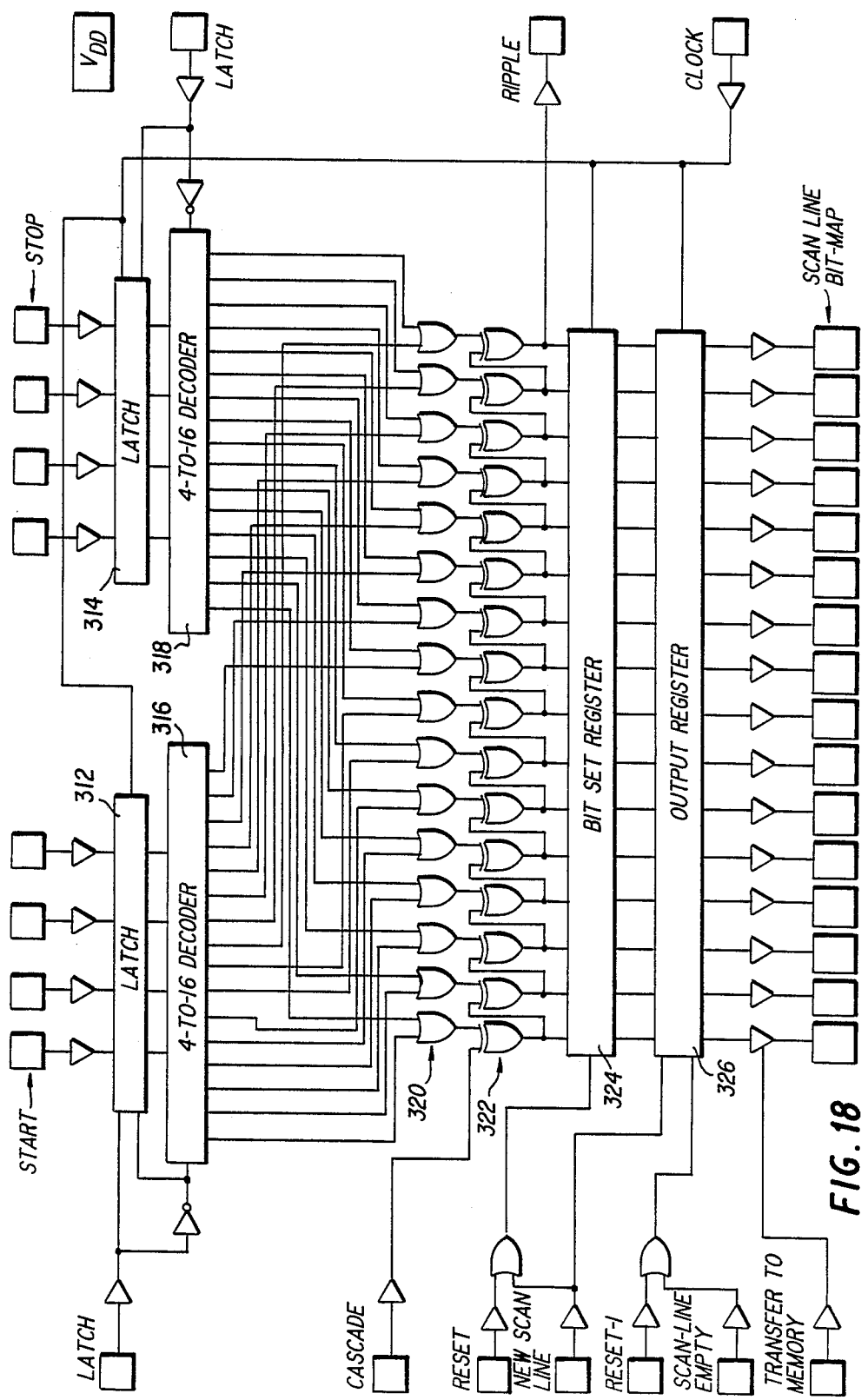

The scan-line algorithm output for every polygonal pattern intersecting the scan-line being processed is a 16-bit word indicating the start and stop locations of the respective pattern's interaction with between which "1"'s are to be written. Since the scan-line each processor computes is 256-bits, both stop and start locations are described with 8-bit numbers. Thus run-length encoded message is output by the processor 200 to the scan line bit producer 300, which is special purpose hardware that produces "1"'s in a 256-bit register between the stop and star locations specified by the processor. The scan line bit producer 300 has a modular architecture shown in FIG. 17, which facilitates fast implementation of the scan-line algorithm. FIG. 18 illustrates details of the circuitry of the modular combinational logic circuits employed.

In FIG. 17, the processor 200 outputs start and stop addresses (2 eight-bit words) which are respectively latched in $I_i$ register 302 and $S_i$ register 304. Coupled to the four most significant bits of the register 302 is a 4 to 16-bit decoder 306, and similarly coupled to the four most significant bits $S_4$–$S_8$ of the register 304 is a 4 to 16-bit decoder 308. Decoders 306 and 308 each have 16 outputs, which are respectively coupled to combinational logic circuits $310_1$–$310_{16}$. Thus, decoder 306 applies an output to one of the combinational logic circuits 310, thereby indicating that the start of an intersection of a polygonal pattern occurs in one of the bits associated with the particular combinational logic circuit 310 to which the output of decoder 306 is applied. Similarly, the decoder 308 applies an output to a combinational logic cell 310, this output indicating that intersection of the polygon with the particular scan-line ends in one of the 16 bits of the respective combinational logic circuits to which the output of decoder 308 is applied. Thus, there are 16 combinational logic circuits $310_1$–$310_{16}$, each of which decodes 16 respective bits of a scan-line, whereby the intersection of each polygonal pattern with a 256-bit scan-line is decoded.

As shown in FIGS. 17 and 18, the four least significant bits of each of the registers 302 and 304 are applied to respective address latch circuits and 4 to 16-bit decoder circuits of each combinational logic circuit 310. More particularly, $I_1$–$I_4$ are applied to address latch 312 and bits $S_1$–$S_4$ are applied to address latch 314. The outputs of latches 312 and 314 are applied to decoders 316 and 318, respectively. Each circuit 310 includes 16 OR gates each having two inputs, one of which is connected to the respective output of the decoder 312 and another of which is connected to a respective output of the decoder 318. Each OR gate 320 has an output connected to a respective exclusive-OR gate 322. The first exclusive OR gate of the circuit $310_1$ has a first input connected to ground, and a second input connected to the output of the first OR gate 320. Thereafter, the output of each exclusive OR gate is connected to the input of the next adjacent exclusive OR gate in cascade fashion. The output of the last exclusive OR gate is connected as a ripple signal to the input of the first exclusive OR gate of the next combinational logic circuit 310.

From the above description, it is seen that the lower four bits of start and stop addresses are applied to each of the combinational logic circuits 310 in addition to respective decode signals from decoders 306 and 308 indicating whether a circuit 310 includes the start and/or stop address associated with the particular polygonal pattern. There are two cases to consider. One is that the start and stop addresses occur in the 16 bits associated with the respective of the logic circuits 310, i.e., a single logic circuit 310 decodes both the start and stop addresses. The second case is that two different circuits 310 decode the start and stop addresses. In the first case, the circuit 310 with the valid decoder signal from decoders 306 and 308 will produce logic "1's" between the start and stop addresses. In the second case, the logic circuit 310 containing the start address will produce logic "1's" from the start address until its 16th bit is set and then will propagate the "ripple" bit to the next logic circuit 310 which will keep setting bits until the stop address is reached.

As also shown in FIGS. 17 and 18, the scan-line bitproducer 300 also includes plural bit set registers 324 having parallel inputs connected to respective outputs of the exclusive-OR gates 322 of each logic circuit 310, and output registers 326 having inputs connected to respective outputs of the bit set register 324. For each scan-line of a data stripe, polygonal pattern intersections with the scan-line are determined based on the respective stop and start addresses associated with each polygonal pattern, and the bits corresponding thereto are set in the bit set register 324. Upon completion of processing of all the data entries corresponding to polygons intersecting a particular scan-line, the information set in the bit set register 324 is transferred to the output register 326, whereupon the bit set register 324 is reset. At that point, processing of a new scan-line and corresponding setting of bits in the bit set register 324 for the new scan-line can be initiated, while at the same time the bits set in the output register from the preceding scan-line can be transferred to the bit-map memory. These two operations proceed concurrently due to the double buffer configuration of the registers 324 and 326.

A particular advantage of a scan-line bit producer 300 according to the invention resides in the fact that once bits of a scan line are set in correspondence with the intersection of a particular polygon with respect to the scan line, those bits remain set for the remainder of processing of that scan-line. If another polygon intersects one or more of the same bits, the set bits remain set and it is not necessary to perform a read-write-erase routine. Thus, greater processing speed and throughput is enabled.

Returning now to FIG. 18, the decoder 318 that decodes the stop address does not have a valid decode for the code 0000. That implies that the first line of the STOP decoder output (i.e., the left-most) is always 0. Therefore, if the start decode is, e.g., 2 and the stop decode is 11, the start decoder 316 is supplied with the code (0001: decimal 1) and the stop decoder 318 is supplied with the code (1011: decimal 11). That will result in setting logic "1's" between the 2nd and the 11th bit of the bit set register 324, the boundary bits (2nd and 11th) included. The first bit in the register in this case is the output of the left-most exclusive-OR gate 322.

The latch signal shown in FIG. 18 as being applied to the latches 312 and 314 is provided by the processor 200 indirectly since it is the output of the decoders 302, 304 shown in FIG. 18. In FIG. 18, the latch signal is designated as L and E (its complement) a it is applied to the latch 312 and the decoder 316 and the latch 314 and decoder 318. This latch signal is used to latch the start and stop addresses and to enable the decoders. The RESET signal shown in FIG. 18 is produced in the processor 200 and is exercised before system operation and also for testing purposes. The NEW SCAN LINE signal shown in FIG. 18 is also produced in the processor and is used to do two things concurrently. First, it is used to transfer data from the bit set register 324 to the output register 326 and then to reset the bit set register 324.

Recapitulating the operation of the scan line bit producer 300, it is again noted that a double buffer scheme used in the bit set register 324 and the output register 326 allows the generation of scan-lines and the transfer of scan-lines to the bit-map memory to be performed concurrently. This is highly desirable because it eliminates the need for wait state in the processor during the data transfer from the scan line bit producer 300 to the bit-map memory 400. The scan line bit producer 300 provides the "1"s for the features intersecting the scan line until the scan-line is processed. The completion of a scan-line is indicated by the processor with a scan-line done signal which is used to transfer the data to the output register 326 of the scan line bit producer 300 and then to the bit-map memory 400. The transfer to the bit-map memory 400 is administered by the direct memory access (DMA-W) controller 410, which uses the same Y address to enable the output of the scan line bit producer 300 and write into the bit-map memory 400. The data is transferred as 32-bit words, and upon completion of the transfer, the DMA-W controller 410 indicates to the processor that it is ready for a next scan-line. This signal resets the output register 326 of the scan line bit producer 300 and enables the transfer of the scan-line between the two registers 324 and 326. The overall operation is repeated until the bit-map memory is filled with the bit-map of the data-stripe being processed. This is indicated by DMA-W controller 410 issuing a memory full signal which is received by the DMA-R controller 420 that controls the transfer of data from the bit-map memory to the register that drive the beam.

The data transfer to the output register 500 that drives the beam takes place on a per scan-line basis, 32-bits at a time, starting with the scan-line at address $X_0$. FIG. 15 also illustrates the portion of the circuit that performs this data transfer operation.

One 32-bit shift register 510 is loaded in parallel from the output of a selected of the bit-map memories $400_1$ or $400_2$. The shift register 510 holds 32 bits of data and drives the fiber-optic link through the electrical-to-optical module at 80 MHz. During the shifting of the 32 bits, a new 32-bit word is loaded to the second shift register 520 which is enabled to drive the fiber-optic link upon completion of the shifting of the first register 510 (i.e., 400 nsec later). The overall operation continues until the bit-map memory is empty, indicated by the DMA-R with a memory empty signal.

As soon as the processor completes the bit-map generation of one data-stripe, the memory bank selector 110 (FIG. 15) switches the processor access to the second DATA-RAM $100_2$, allowing the processor to start the bit-map generation of a data-stripe from the next segment-stripe to be written. During this time, the host computer 20 and disk drive 30 is loading the idle DATA-RAM with a data-stripe from the segment-stripe to be written after the one currently being processed. In the same fashion, the address distribution hardware (FIG. 15) enables one bit-map memory to be filled with the bit-map of the currently processed data-stripe while the other bit-map memory is read into the shift register 500 during the writing of the previously computed bit-map of a data-stripe.

Although it may seem redundant to allocate memory resources for storing the bit-map of an entire data stripe while it is being produced in real-time, there are certain aspects of the problem that support this approach. If a buffer smaller than the bit-map memory is used, then after the writing is initiated, each processor would have to provide a 256 bit scan line segment at a constant rate in order to keep the data flow to the beam constant. However, the time required for producing a scan-line on a processor is not constant; it depends on the number of features that the line intersects. Therefore, it is possible for the processor to exceed the available time for the production of a scan-line, which will result in system failure to write the correct pattern. Memory allocation for storing the bit-map eliminates the possibility of this error, and it will result in stopping the beam, after writing a complete segment stripe, in the worst case. This will also be the result when a higher number of features intersect the scan-line due to larger scale integration patterns to be encountered in future chip designs.

There are several important observations to be made concerning the architecture and organization of this processing module.

1. All resources are utilized 100% of the time during writing, and the writing is performed in real-time.
2. A double buffer scheme in the scan line bit producer 300 shift register minimizes the time the processor must wait for processing the next scan-line. In most cases, wait-time is anticipated to be zero.
3. The bit-map memory 400 does not have to be cleared by writing "0"s (currently the case with existing pattern conversion systems) between successive bit-map generations. This is performed with a single clock at the scan line bit producer 300 before the initiation of the bit-map generation for a scan-line. Therefore, the bit-map memory is written through "Write" cycles and not "Read-Modify-Write"—a very significant speed-up.
4. The processor does not perform bit-map memory addressing, writing and masking, but uses all of its power for the run-length encoding of the data-stripe scan-lines.
5. Interface between each module and the host computer is simple and minimal.
6. The high speed (80 MHz) signal that drives the E-beam is immune to digital noise due to its transmission through a fiber-optic link, and therefore, the probability of error due to noise is minimal.

Figure 19:
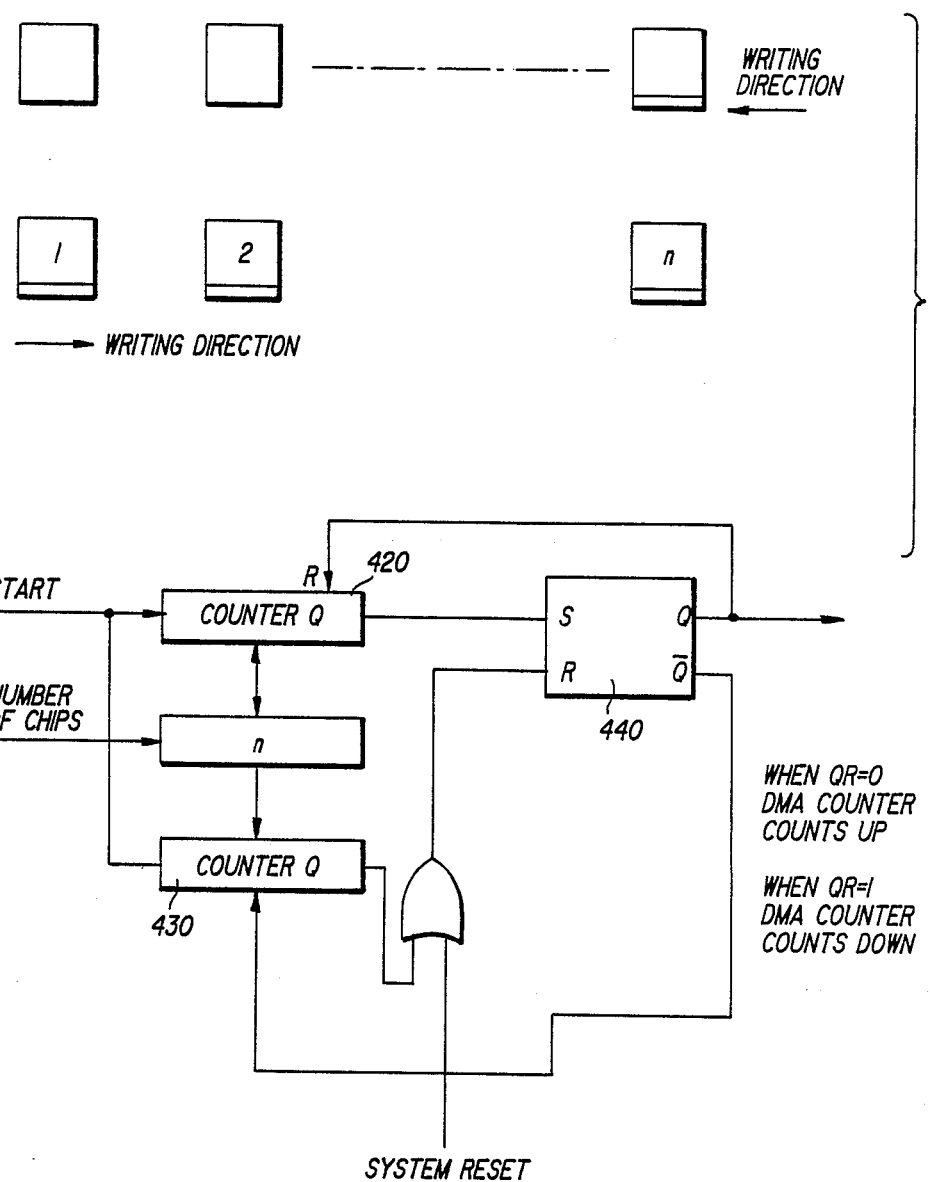
FIG. 19 is an illustration including a circuit diagram of serpentine writing control logic according to the invention.

In general, the E-beam system may have to write n-patterns, which can be identical or different. These patterns can be in a linear or two-dimensional array. The writing of the first segment stripe (i.e., Y-1) will be written on the +x direction for all n-patterns, and upon completion of this operation, the second segment stripe (i.e., Y-2) will be written on the −x direction. If the array is two-dimensional, the first stripe of the second row will be written in the −x direction. If the case concerns a single pattern, the second segment stripe (i.e., Y=2) will be written in the −x direction. FIG. 19 illustrates the writing direction in the general case and the logic that controls this operation.

The number of patterns to be written presets two count-down counters 420 and 430 which are advanced with a start signal issued by the host computer every time the writing of a segment stripe begins. Although both counters are advanced with the same signal, only one is actually enabled since the other one is continually reset by the output of the S/R flip flop 440. When the writing of the segment stripe (currently in progress) is performed for all n-patterns, the enabled counter issues a valid count that changes the state of the flip flop and, therefore, its output. Now the second counter is enabled, and the previously enabled counter is disabled. The output of the flip flop 440 is used as a control signal in the DMA circuit 410, 420 (FIG. 15) that controls transfer of the data from the bit-map memory 400 to the output shift register 500. As indicated in FIG. 19, when QR=0 the DMA counter counts up and accesses data starting from memory location $X_0$, while it counts down when QR=1, thus starting from memory location $X_{32767}$. This scheme places the correct data in the shift register that drives the beam so serpentine writing can be achieved. If a single pattern is being written, the counters are preset to one. It should be noted here that this scheme ensures the supply of correct data to the beam for achieving serpentine writing, but it does not control the actual position of the stage which is performed by the host computer 20.

Next described in an overview of the operation of the processor 200, followed by a detailed description of a flow chart of the operation of processor 200.

Initially all polygon entries are stored in a static table, as illustrated in FIG. 10, and the active table is empty. As each line is being processed the bucket in the static table for the current scan line is searched to see if it contains any entries. These would correspond to polygons which have their minimum X value falling on the current scan line. If the bucket in the static table corresponding to the current scan line does contain entries, then this linked list is inserted into the active list.

It takes three VAX instructions for the per scan-line overhead function of static table searching. Once the static table entries are in the active list, only three VAX instructions are necessary per polygon to output the start and stop addresses of the bits to be set in the current scan-line by the scan line bit producer 300.

The first time a polygon becomes active no start/stop calculation is necessary; the initial values are simply output. After the first occurrence of a polygon, all succeeding occurrences require the calculation of the new start/stop addresses. The new value is the sum of the old start/stop addresses plus the top and bottom slopes. Rectangles have slopes of zero so the new values are equal to the old ones.

As was above explained, the addresses that the bit-map/scan-line hardware uses are each eight bit unsigned numbers. Seven additional, fractional bits are kept for extra precision. The slopes are stored as signed sixteen bit numbers with seven bit fractions. Both addresses are generated in one instruction, for performance reasons.

After new start/stop generation these addresses are output. Then the current figure's maximum X value is compared with the X value of the current scan line. If this is the last scan-line which will intersect the current polygon, then that polygon is removed. Otherwise pointers are updated and the process loops.

When processing gets to the end of the active table, the bucket in the static table corresponding to the current scan line, i.e., the scan line being processed, is searched for data entries. If any exist, these static table data entries are added to the active table.

Removing polygons which have been completely filled from the active table is the most complex operation of all when the data are in the extended EBES format. If a polygon is to be repeated then an entry must be inserted in the bucket corresponding to the X value of the next scan-line on which the polygon will appear. Several arithmetic operations are required: REPEAT count decrementing, and XORIGIN and XMAX updating using the repeat INTERVAL. Entries are always inserted at the head of the linked list using the static table list head. This is possible because it is not necessary for the linked lists to be internally sorted.

Figure 20A:
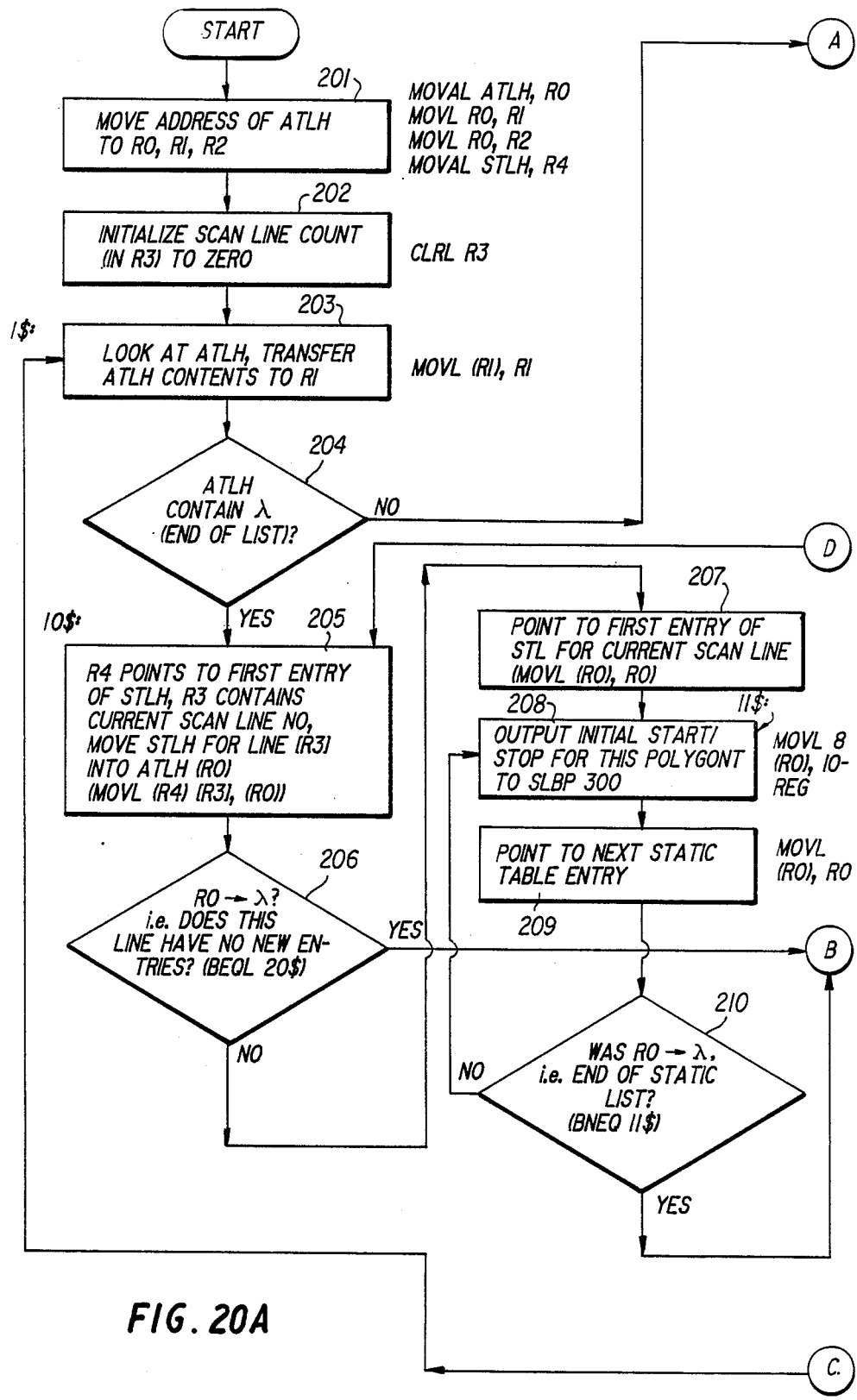
Figure 20C:
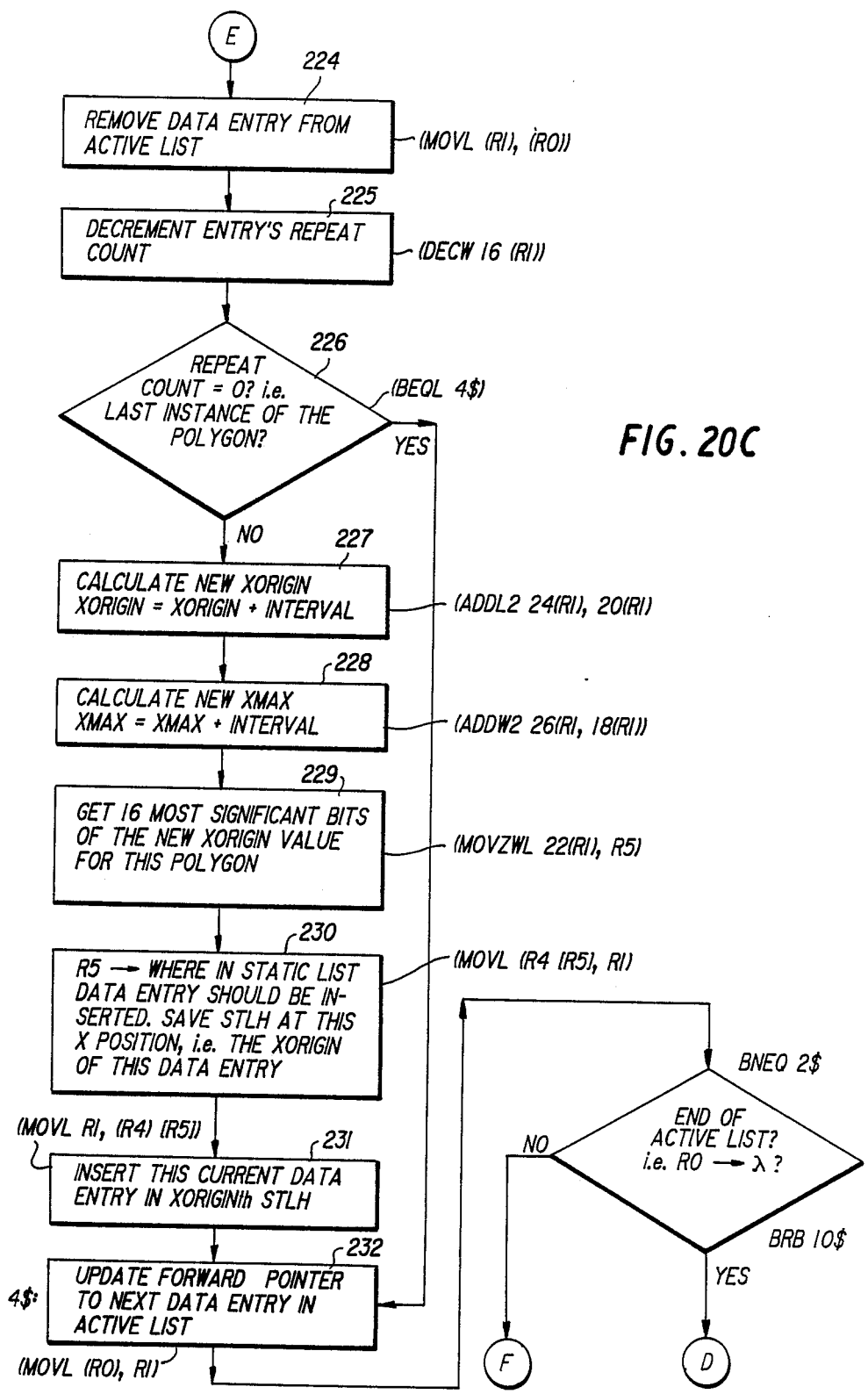
Figure 21:
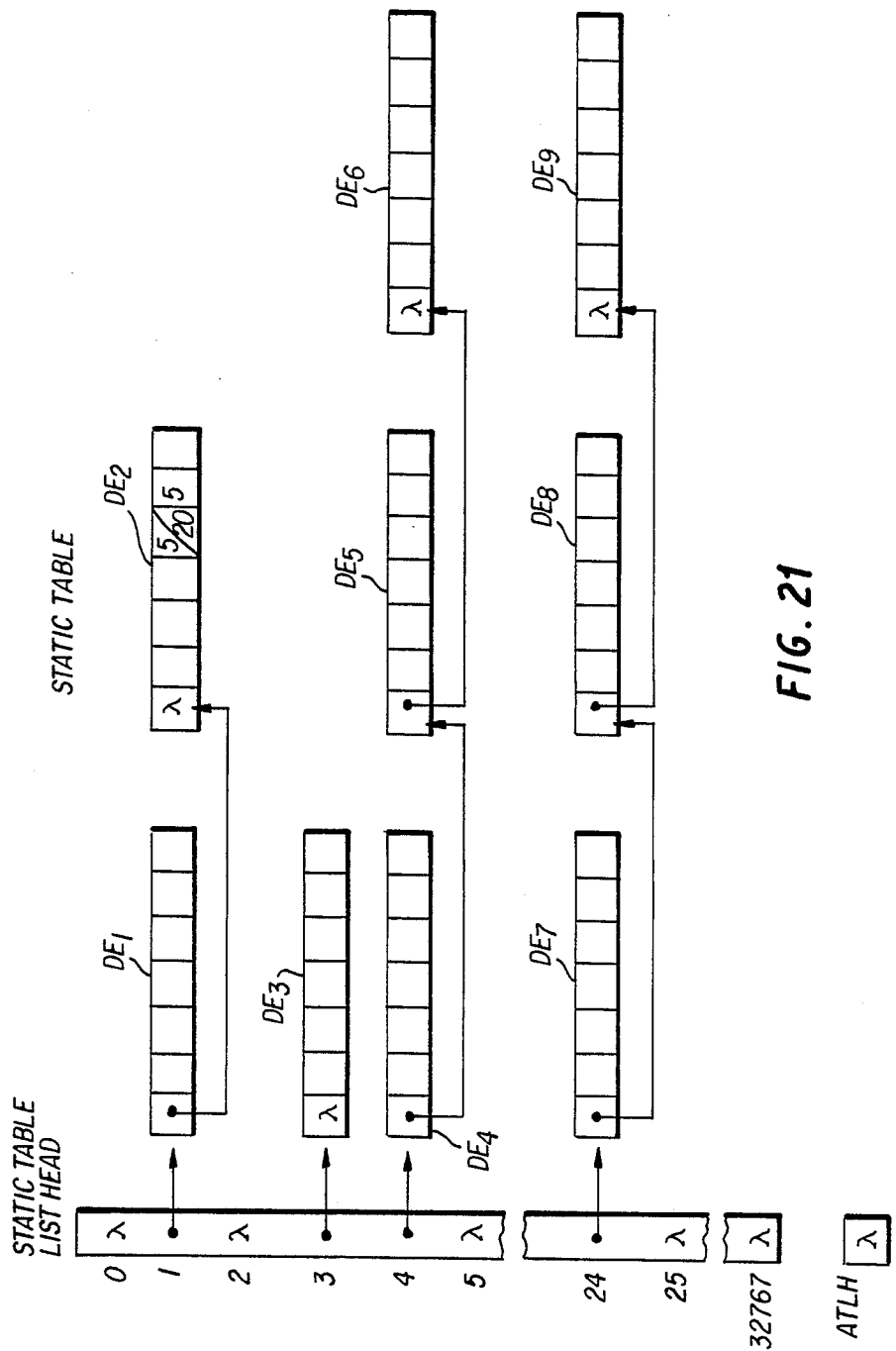
FIG. 21 is an illustration of an example of data entries of a static table for explaining the steps of the flow chart show in FIGS. 20A, 20B and 20C.

FIGS. 20A, 20B and 20C are a detailed flow chart of the operation of the processor 200 of the invention. Appendix 1 illustrates the program used by processor 200. The flow chart shown in FIGS. 20A, 20B and 20C is directed to implementing the initial processing steps based on predetermined data entries existing in the static table, as shown in FIG. 21. In particular, a flow chart shown in FIGS. 20A, 20B and 20C illustrates the processing steps in producing bit-map data corresponding to two data entries $DE_1$ and $DE_2$ having XMIN values indicating initial intersection of the respective polygons with the first scan line, a single data entry $DE_3$ having an XMIN value indicating initial intersection of the respective polygon with the third scan line, three data entries $DE_4$, $DE_5$ and $DE_6$ having XMIN values indicating initial intersection of the respective polygons with the fourth scan line, and three data entries $DE_7$, $DE_8$ and $DE_9$ having XMIN values indicating first intersection of the respective polygons with the 24th scan line. In FIGS. 20A, 20B, 20C and 21, notation "$\lambda$" means the end of the list, or that the address is empty, signified by the use of a predetermined number, such as 0, in the machine. The arrows pointing, for example, from the static table list head to individual data entries, and between the data entries, indicates that the place from which the arrow emanates contains the address, or "points to" the address of the object at the end of the arrow. Further, the processor 200 includes, in this instance, plural registers, R0-R6, which are used to store various addresses and/or the contents thereof during processing of the data entries according to the operation shown in the flow chart of FIGS. 20A, 20B and 20C. Appendix 1 attached hereto shows the detailed program steps implementing the flow chart, and FIGS. 20A, 20B and 20C include references to the program of Appendix 1 to which the respective flow chart blocks pertain.

The first step 201 of processing a new scan line, as shown in FIG. 20A, is to move the address of the active table list head (ATLH) to registers R0, R1 and R2. In step 202, the scan line count is initialized in register R3 to zero, followed by the step 203 in which the contents of the address stored in the ATLH is stored in register R1. Step 204 is to determine whether the ATLH contains $\lambda$, meaning the end of the list, and in this instance the answer is affirmative and step is 205 is then performed. At this point, R4 points to the first entry of the static table list head and R3 contains the current scan line number. Using this information, the list head for the scan line designated by R3 is moved into the ATLH and the ATLH is pointed to by R0. Then step 206 is performed, in which it is determined whether R0 points to a ($\lambda$), i.e., is to determine whether this line has any new polygons on it. In the example shown in FIG. 21, R0 at this point points to zero so that there are no new polygons and branch is then taken to step 216. In this step, the back pointer, register R0, is reset with the address of the address of the active table list head (R2), but in the example shown in FIG. 21, 216 does nothing since R2 already equals R0. Step 217 is then performed, in which the forward pointer R1 is reset with the address of the active table list head R2. Then, in step 218 the $0_{start}/0_{stop}$ signal is sent to the scan line bit producer 300 indicating an end of the scan line. In the next step, step 219, the scan line counter (R3) is incremented to the next scan line, i.e., scan line 1, and in step 220 it is determined whether or not the scan line count is greater than the maximum number, i.e., 32,767. In the example given, the result of step 220 is "no", indicating that there are more lines to be processed, and branch is taken back to step 203. Step 203 is again performed, and again since there are no data entries in the ATLH at this point, R1=$\lambda$.

Since the ATLH still contains $\lambda$, step 204 results in taking a branch to step 205. In step 205, R3 indicates the present scan line is scan line 1, and as shown in FIG. 21, there are two data entries on scan line 1. The list head for scan line 1 is then moved into the ATLH, which is pointed to by register R0. Thus, after step 205, the ATLH points to the list for scan line 1. In step 206, R0 points to an address which is not $\lambda$. Therefore, step 207 is performed such that R then points to the first entry of the static table list for scan line 1. After step 207, R0 contains the same data as the ATLH, in the example, i.e., the address of the first entry of the list for scan line 1. Thus, after performing step 207, the active list is now the two entries on scan line 1.

Then in step 208, start/stop fields of the data entry for the polygon pointed to by R0 are outputted to the scan line bit processor 300. Then, in step 209, R0 is incremented to point to the next entry in the static table. In other words, step 209 forms the step of copying the contents that R0 was pointing into R0 itself so that R0 then points to the next entry in the list. Step 210 is then performed, and since in the example R0 was not pointing to a $\lambda$, branch is made back to step 208 and the start/stop data fields of the second data entry on scan line 1 are outputted to the bit scan line producer 300. Step 209 is repeated but since R0 then points to $\lambda$ indicating the end of the static list such that branch is then made to step 216.

In step 216, the back pointer R0 is reset to the first address of the active table list head indicated in R2. Step 217 is then performed in which forward pointer R1 is reset with the address of the active table list head R2. Then, in step 218 the $0_{start}/0_{stop}$ signal is sent to the scan line bit producer 300 indicating the end of the scan line and the transfer of the bits set in the bit set register 324 to the output register 326. In the next step, 219, the scan line counter R3 is incremented, and it is then determined whether or not the last scan line is being processed (step 220). In the example, the answer is negative and branch is made back to step 203 for processing of scan line 2 shown in FIG. 21.

Continuing in the example shown in FIG. 21, processing proceeds to step 203, it being assumed that the data entries in the active table correspond to polygons intersecting plural scan lines such that these data entries remain in the active table. Thus, in step 203 the ATLH address is stored in register R1 and then step 204 is performed to determine whether or not ATLH contains $\lambda$ meaning the end of the list. In this case, the ATLH does not indicate the end of the list. Therefore, a branch is not made to step 205, as before, but instead branch is made to step 211, where the slopes from the first data entry in the active table is added to the start/stop values to produce new start/stop values for scan line 2. The new start/stop values are put back into the start and stop fields of the respective data entry and the newly calculated start/stop values are output to the scan line bit producer 300 in step 212. Then, in step 213, the XMAX value of the current data entry is compared with the present scan line, and assuming that the XMAX field of the data entry is greater than 2, the number of the present scan line, then step 214 branches to step 221 and the backwards pointer is updated so that register R0 points to the same address as register R1. In this instance, both R1 and R0 point to the pointer address of the first data entry $DE_1$, which in turn points to the pointer field of the second data entry $DE_2$ shown in FIG. 21. At this point, step 222 is performed and the forward pointer is updated such that R1 points to the pointer field of data entry $DE_2$.

At this point, in step 215 it is determined that R1 points to the pointer of $DE_2$ indicating that another entry of the active table must be processed. Therefore, branch is made to step 211 where the slopes are added to the start/stop values of the data entry $DE_2$. At step 212 the newly calculated start/stop values, indicating intersection of the respective polygon with the second scan line, are output to the scan line bit producer 300. Then, in step 213 the XMAX value of the current polygon, (i.e., corresponding to data entry $DE_2$) is tested to see if this the last scan line that it appears on. Assuming that it is not the last scan line, steps 21 and 22 are then performed. After step 21, R0 and R1 both point to the same address, i.e., the pointer of $DE_2$. After step 22, the $\lambda$ value stored in the pointer address of $DE_2$ is put into R1, thereby updating the forward pointer. In step 215 it is determined that a $\lambda$ value existing as the forward pointers stored in R1 indicating that there are no more data entries in the active list. Therefore, branch is made to step 205.

In step 205, based on the contents of register R4, i.e., the first entry of the static table list head, and register R3, i.e., the current scan line number, the static table list head corresponding to the current scan line indicated in R3 is moved to the ATLH pointed to by register R0. In the example given at FIG. 21, there are no new polygons for scan line 2. Therefore, in the next step, step 206 the condition indicated in FIG. 20A is satisfied so branch is made to step 216. Steps 216 through 218 are then performed, resulting in the sending of a $0_{start}/0_{stop}$ signal to the SLBP 300, indicating end of processing of the second scan line. Scan line counter is incremented in step 19 compared with the maximum number of scan lines in 20 and then, in the example given, branch is made back to step 203. In step 203, the ATLH includes the address of the first data entry in the active table list head, which again corresponds to data entry $DE_1$. Therefore, after step 203 R1 points to the address of the pointer of data entry $DE_1$. The two data entries $DE_1$ and $DE_2$ in the active list are then processed as above described in steps 211–215, whereupon branch is made back to step 205.

At this point in the operation, data entry $DE_3$ of scan line 3 is added to the active list. This is accomplished in step 205 by putting into register R0 the static table list head for scan line 3. Step 206 is then performed, and it is determined that a new polygon corresponding to data entry 3 has been added to the active table. Next, in step 207 the contents of the address indicated in R0 are moved to R0, and in step 208 the initial start/stop for the polygon corresponding to data entry $DE_3$ is output to the SLBP 300. In the next step, 209, the pointer address of the data entry $DE_3$ is moved into register R0. Then, in step 210 it is determined that data entry $DE_3$ is the last entry in the static table for scan line 3. Branch is then made to step 216 and steps 216–220 are repeated. In the next sequence of events, the active table data entries are processed for intersection with scan line 5, and data entries $DE_4$, $DE_5$ and $DE_6$ for scan line 4 are moved from the static table to the active table. These processing steps occur in the same way as above described.

It is now assumed that the processing has proceeded to the processing of scan line 20 such that R3=20. It is further assumed that the second data entry in the active table, $DE_2$ has an XMAX field equal to 20 so that this data entry must be removed from the active table on scan line 20. It is further assumed, as shown in FIG. 21, that the repeat field of data entry $DE_2$ equals 5, that the XORIGIN field equals 1, and the INTERVAL field equals 23.

With the above assumptions in mind, it is now further assumed that processing of data entry $DE_1$ on line 20 has been completed and a sequence of steps is at step 213 in the processing of data entry $DE_2$. Thus, step 213 sets up the tests to determine if XMAX of the currently pointed to data entry $DE_2$ is equal to the current scan line number. In step 214, it is determined that XMAX of $DE_2$ equals the current scan line number and then branch is made to step 224. Removal of $DE_2$ from the active list is accomplished by changing the pointer address of $DE_1$ to point to the address of the pointer of $DE_3$ using the registers R0 and R1. After this is accomplished, step 225 is performed and the repeat field of $DE_2$ is decremented from 5, for example, to 4. Since the repeat field is not yet 0 after step 225, step 226 continues processing to step 227 for calculation of a new XORIGIN field for $DE_2$. Since the new XORIGIN equals the old XORIGIN plus the number indicated in the INTERVAL field of $DE_2$, the new XORIGIN field equals 1 plus 23 which equals 24. And, in step 228, a new XMAX is computed based on the old XMAX plus the number indicated in the INTERVAL field, which in this case is 20 plus 23 which equals 43. Then, in step 229, the most significant 16 bits of the new XORIGIN value for $DE_2$ are obtained and placed in register R5. In step 230, R5 contains the place in the static list where the polygon corresponding to $DE_2$ should be inserted. Therefore, in step 230, the static table list head is saved at this X position, i.e., at $DE_2$'s XORIGIN. After step 230, $DE_2$ removed from the active list points to the first polygon in the static list for line 24. In step 231, the current polygon represented by $DE_2$ is inserted in the static list head scan line corresponding to the XORIGIN of $DE_2$. After step 231, the static table list head for line 24 points to the data entry $DE_2$, whereby data entry $DE_2$ has been reinserted into the static list on line 24 because of the repeat in interval fields present in $DE_2$, i.e., because the data entry $DE_2$ required repeat of the polygon at 23 line intervals after it started on line 1. Thus, after step 231 at this stage of the processing, the pointer of $DE_2$ points to the pointer address of $DE_7$ shown at FIG. 21, the REPEAT field of $DE_2=4$, XMAX=43, XORIGIN=24 and INTERVAL=23. In step 232, the forward pointer is updated for processing of the next entry in the active list. In step 233, it is determined if processing of active list for the current scan line is completed. If completed, branch is made to step 205, and if not, branch is made to step 211 for further processing of data entries on the active list.

Recapitulating, this invention is directed to a real time data rasterization system based on a novel multiprocessor architecture with multitasking and a novel scan-line algorithm. The data rasterization system, when used in an exposure system in which an electron beam selectively irradiates multiple abutting strip areas of a wafer for providing beam blanking data, includes a first pattern memory for storing figure data which describe features of a pattern contained in a data segment which contains up to 80000 standard EBES figures or $10^6$ extended EBES figures. The pattern memory provided for this purpose is organized in a double buffer scheme so that pattern data can be loaded to the memory during data rasterization. Further provided is a bit-map memory for storing the bit-map form of the pattern data contained in a data segment which is formed of 2048×32768 address units. The bit-map memory provided for this purpose is organized in a double buffer scheme so that bit-map data can be used for providing beam blanking data during data rasterization. The system of this invention further includes data transfer means for controlling the figure data transfer from a general purpose computer to the data conversion system pattern memory, and also data transfer from the bit-map memory to the beam blanking circuitry; and a processor for real-time conversion of polygonal pattern data described as either standard or extended EBES figures, one data segment at a time composed of eight data stripes. Conversion of data segments is pipelined, without introducing delay between two consecutive data segments, which constituted real time data conversion.

In the novel scan-line algorithm, pattern figures are EBES figures with arbitrary angles which are described in a different than standard EBES format. Pattern data is stored and processed with one entry per polygon rather than the conventional way of one entry per edge. Polygon top and bottom edges are always parallel to the beam scan direction and can be ignored. The slopes of the two side edges are stored in the single polygon entries.

In the prior art polygon rasterization requires the sorting of polygon edges in both the X and Y dimensions. By keeping polygon information together in a single entry the algorithm requires only a single dimension sort which is done using buckets of linked lists. The linked list elements do not have to be sorted and the algorithm operates in linear time. This represents a savings in sorting time proportional to the number of polygons.

Substantial additional performance is gained by having the polygon processors 200 not be required to read-modify-write to bit-map memory in order to set bit patterns in this memory. The polygon processors simply go through a list of the polygons intersected by the current scan line and output to the scan line bit producer 300 the start and stop bit addresses of each polygon segment occurring on the current scan line.

In addition, even the scan line bit producer 300 does not require read-modify-write cycles to bit-map memory. It builds a single scan line in its own shift register and writes to memory without a previous read cycle.

According to the invention the pattern conversion system is composed of a plurality of data conversion modules each including a dual pattern memory, a processor, a scan line bit producer, a dual bit-map memory and control for data transfer and address distribution. All modules are loosely coupled through an I/O computer which provides data and control communication with the system's general purpose host computer. The modularity of the architecture allows the addition or deletion of modules as it is proper for different applications. The module outputs are all connected through a 32-bit bus to a dual shift register that provides the serial blanking data to the beam. The double buffered shift register allows for real time blanking since data transfer and blanking are overlapped.

The dual pattern memory in each module is addressed through a multiplexed scheme. The memory module receiving pattern data from the host computer is addressed by the I/O computer while the module providing pattern data to the processor is addressed by the processor. In the same system, the dual bit-map memory in each module is addressed with a multiplexed DMA (Direct Memory Access) scheme. One module is addressed by a DMA controller providing write addresses causing the bit-map to be transferred from the scan line bit producer to the memory while the other module is addressed by a DMA controller providing read addresses and causing the bit-map to be transferred from the memory to the blanking register.

According to the invention, the I/O computer provides address and data information to all the pattern conversion modules at a rate equal or higher than the rate of bit-map conversion of a data segment. Also, the processor in each pattern conversion module is a 32-bit microprocessor which runs the scan-line algorithm above described. The scan line bit producer of each module is composed of: a 256-bit shift register, a network of OR and XOR gates and two decoders. This circuit produces the bit map of a pattern using as input only the start and stop addresses, provided by the processor.

Further according to the invention, the blanking dual register provides blanking data to the beam through a fiber link with a bandwidth exceeding 80 Mbits/sec. The register provides data to the electrical-to-optical conversion circuit which drives the fiber link. The data is converted back to electrical by the optical-to-electrical circuit which drives the beam blanking circuit.

Further, the system according to the invention has a control capability for writing n-identical patterns while performing the pattern data to bit-map conversion once and for serpentine writing.

Further, an error detection and correction coding scheme is used in storing bit-map data into the bit-map memory. This scheme allows for double error detection and single error correction.

Further, the system control according to the invention identifies when the pattern to be converted exceeds the system capacity for real time operation. This results in performance degradation (non-real time operation) but does not render the machine unable to perform the pattern conversion.

Thus, according to the system of the invention, pattern data in standard and extended Electron Beam Exposure System (EBES) format are converted to a bit-map in real-time using a novel scan-line algorithm and a novel multiprocessor architecture with multitasking. Pattern data are composed of EBES figures with arbitrary angles, and they are transformed to a bit-map on a per segment-stripe basis in real time. The bit-map is used to provide continuous data to the E-beam thus making possible the real-time writing of 1X, 5X, 10X mask layer patterns used for integrated circuit fabrication. The system is capable of handling both standard (i.e., no figure repetition) and extended (i.e, high figure repetition) EBES patterns conforming to 0.5 $\mu$m design rules to be exposed with 0.25 $\mu$m beam spot size. The maximum number of figures in a segment stripe that the system handles is $8 \times 10^4$ (standard EBES) or $10^6$ (extended EBES). These figures are transformed into a $2048 \times 32K$ bit-map, and are exposed at a bit rate of 80 MHz. This data volume is sufficient for the exposure of a 16-Megabit memory chip which is far beyond today's state-of-the-art semiconductor technology.

There are several advantages of the system according to the invention compared to similar systems. Existing figure-to-bit-map conversion systems, employed in E-beam lithography equipment, are based on a uniprocessor architecture experiencing various levels of performance but are unable to achieve real time exposure of patterns and/or reticles. These systems rely on a special purpose processor and on polygon writing algorithms to produce the bit-map of the pattern to be exposed. The large amounts of data required by today's very large scale integrated circuits, along with the inefficiencies of polygon writing algorithms, reduce dramatically the throughput of the E-beam lithography equipment employing these systems. Efforts to increase the system throughput by employing faster circuits in the uniprocessor design has some effect but they cannot overcome the processor-memory communication bottleneck with the existing technology.

Overall, there is no known E-beam lithography equipment operating in the field no proposed system architectures capable of real time writing of masks and/or reticles. The rasterization system of the present invention offers this capability through a powerful scan-line algorithm implemented on a novel system organization. In addition, the present system is capable of handling segment stripes containing up to $10^6$ figures, thus being able to expose in real time patterns of integrated circuits which are likely to be developed in the next five to ten years. The utilization of a fiber optic link, instead of copper wires, to carry the signal that drives the E-beam eliminates the noise interference that highly affects the 80 MHz signal causing error in the written pattern.

Finally, the architecture and organization of the rasterization system according to the invention has two unique characteristics which are of great importance: modularity and the ability to gracefully degradate instead of failing. Since each processor module has its own input and bit-map memories and communicates with the host computer and the register that drives the beam through buses, any number of processors (up to 16 that are allowed by the control) can be added to the system without need for redesign. On the other hand, if a processor module fails, it informs the host computer 20, and its load is assigned to some other processor. This action will decrease the system throughput, but it will not cause system failure or zero throughput. This is only possible because each processor module is a self-contained processing and data management unit. Modularity and graceful degradation ability are missing from the conventional uniprocessor based systems, while the conventional parallel processor system has some sort of modularity, but it is lacking the ability to gracefully degradate since all processors share the same pattern memory and this is a single point failure.

Obviously, numerous modifications and variations of the present invention are possible in light of the above teachings. It is therefore to be understood that within the scope of the appended claims the invention may be practiced otherwise than as specifically described herein.

APPENDIX

```
        title proc
;+
;       proc.mar        — VAX Macro Assembler version of E-Beam
;                           bit-map generator.
;
;       history:        — Version 1.0 created by J. L. Pierce 4-FEB-1985
;                         Version 1.1 speedups (removal branching, per scan-
;                           line overhead) added, bit-map arguement added,
;                           jlp 5-FEB-1985
;
```

APPENDIX-continued

```
;       arguements:
;           4(ap)               — Address of Static Table List Head
;           8(ap)               — Address of Bit-Map region (used for testing output)
;
;       output:
;           Sends a start and stop 8 bit address contained in a 32 bit
;           word to register IO_REG. For testing this data can
;           be sent to the Bit-Map region passed in as arguement two. This
;           version sends to IO_REG. To save data change IO_REG to (R6)+
;
;       register usage:
;           r0  — back pointer during active table processing, forward
;                 pointer during static table processing.
;           r1  — forward pointer during active table processing.
;           r2  — contains the address of the active table list head.
;           r3  — contains the number of the scan line currently being
;                 generated
;           r4  — points to the static table list head
;           r5  — working register
;           r6  — can be used as pointer to output bit-map
;
;       data structures:
;           table entry     —    (r1)       pointer LONGWORD
;                                4(r1)      slopes for top and bottom edges LONGWORD
;                                8(r1)      current start/stop value in y LONGWORD
;                                12(r1)     initial start/stop value in y LONGWORD
;                                16(r1)     EBES feature repeat count WORD
;                                18(r1)     XMAX feature value WORD
;                                20(r1)     XORIGIN of feature LONGWORD
;                                24(r1)     INTERVAL between repeated features LONG
;           static list head  —
;                                (r4)       32768 LONGWORD list heads for linked
;                                           lists
;
;           static table              sorted linked lists (using the static
;                                     table list head) with one table
;                                     entry per extended EBES feature
;—
            .psect start_stop, noexe,4
atlh::                          ; list head for active table
            .long   0
            .psect code, nowrt,4
            .entry proc,   M<r2,r3,r4,r5,r6>
;+
;       initialization
;—
            moval   atlh, r0        ; initialize back pointer
            moval   atlh, r1        ; initialize forward pointer
            movl    r1, r2          ; initialize active list head
            movl    4(ap), r4       ; get address of static list head
                                    ; equivalent to "moval stlh, r4"
            clrl    r3              ; initialize line to zero
;+
;       for testing without Scan Line Bit Producer, activate the following
;       line and change all references to IO_REG to (r6)+
;—
            movl    8(ap), r6       ; initialize output pointer
;+
;       begin main loop here
;—
1$:         movl    (r1), r1        ; any active feature to process?
            beql    10$
;+
;       active table processing
;—
2$:         addl2   4(r1), 8(r1)    ; add SLOPES TO START/STOP
            movl    8(r1), IO_REG   ; output new START/STOP
            cmpw    18(r1), r3      ; test XMAX for entry removal
            bneq    3$              ; branch if no removal
;+
;       removal of entry from active table and possible reinsertion into
;       static table
;—
            movl    (r1), (r0)      ; remove entry from linked list
            decw    16(r1)          ; decrement REPEAT
            beql    4$              ; branch if this is last feature for this entry
            addl2   24(r1), 20(r1)  ; XORIGIN = XORIGIN + INTERVAL
            addw2   26(r1), 18(r1)  ; XMAX = XMAX + INTERVAL
            movzwl  22(r1), r5      ; get XORIGIN most significant word
            movl    (r4)[r5], (r1)  ; save static table list head for target line
            movl    r1, (r4)[r5]    ; put this entry in target static table listhead
4$          movl    (r0), r1        ; update forward pointer
```

APPENDIX-continued

```
             bneq    2$             ; go do an other active entry
             brb     10$            ; no more active entries, go do static entries
3$           movl    r1, r0         ; update back pointer
             movl    (r1), r1       ; update forward pointer
             bneq    2$             ; go do another active entry
;+
;            static table processing
;                    r0 becomes the forward pointer. Backward pointer
;                    is unnecessary because there will be no removals after
;                    only one line of a feature.
;-
10$          movl    (r4)[r3], (r0) ; get static list head for line [r3]
             beql    20$            ; this line is empty
             movl    (r0), r0       ; point to first entry
11$          movl    8(r0), IO_REG  ; output START/STOP
             movl    (r0), r0       ; update forward pointer
             bneq    11$            ; keep going until no more features
;+
;            end of main loop, reset pointers to process next line
;-
20$          movl    r2, r0         ; reset back pointer w/ addrs. of act. list head
             movl    r2, r1         ; reset forw pointer w/ addrs. of act. list head
             clrl    IO_REG         ; mark end of line
             aobleq  #32767, r3,1$  ; do next line (of 32768)
             ret                    ; done
```

What is claimed as new and desired to be secured by Letters Patent of the United States is:

1. A rasterization system for converting plural polygonal pattern data each defining the shape and location of a respective polygon in a two dimensional field into respective bits of a two-dimensional bit-map, wherein the respective bits of the bit-map and the locations of said respective bits within said bit-map correspond to the shapes and locations of the polygons in said two dimensional field, said bit-map divided into plural data stripes, each data stripe including plural scan lines, each scan line including plural bits, comprising:

means for converting said plural pattern data of a data stripe into plural respective linked data entries such that data entries which correspond to polygons intersecting the same scan line are sequentially linked from one data entry to a next data entry;

first memory means for storing said plural linked data entries;

processor means coupled to said first memory means for receiving said plural linked data entries from said first memory means and processing the received linked data entries by determining for each scan line the bits thereof intersected by each polygon represented by the respective linked data entries, said processor means setting each bit so determined to a predetermined logic state and producing bit-map data corresponding to the set bits;

second memory means coupled to said processor means for storing said bit-map data for each scan line of said data stripe, wherein the two dimensional bit-map of the plural polygonal pattern data corresponding to said data stripe is formed and stored in said second memory means; and means for reading out sequentially the bit-map data stored in said second memory means.

2. A system according to claim 1, wherein:

said first memory means comprises first and second double buffer memories interconnected such that one of said double buffer memories outputs to said processor means data entries corresponding to a first data stripe while the other of said double buffer memories receives and stores data entries corresponding to a second data stripe from said converting means; and said second memory means comprises third and fourth double buffer memories interconnected such that bit-map data corresponding to said first data stripe is being loaded into one of said third and fourth double buffer memories from said processor means while bit-map data corresponding to a third data stripe is being read out from the other of said third and fourth double buffer memories.

3. A system according to claim 2, wherein said processor means comprises:

a processor for determining, for each polygon corresponding to each linked data entry intersecting a scan line, a start point and a stop point where the polygon corresponding to said data entry intersects said scan line and for outputting start/stop words corresponding thereto; and a scan line bit producer for setting bits in each scan line in correspondence with said start/stop words.

4. A system according to claim 3, wherein said scan line bit producer comprises:

gating means having outputs corresponding to the number of bits in a scan line for decoding said start/stop words and outputting a predetermined logic level on the outputs of the gating means in correspondence with decoding of said start/stop words; and a first register having plural memory stages each having an input coupled to a respective gating means output and an output which is set after decoding by said gating means whenever said gating means outputs said predetermined logic level, said first register outputs remaining set, once set during processing of a scan line, for the duration of processing of said scan line.

5. A system according to claim 4, comprising:

said scan line bit producer comprising a second register having inputs coupled to the outputs of said first register and an output coupled to read inputs of said third and fourth double buffer memories;

first control means for transferring the outputs of said first register to said second register upon completion of processing of all data entries corresponding to a scan line, for the clearing said first register for processing of a next scan line, and for transferring the outputs transferred to said second register to said read inputs of said third and fourth double buffer memories.

6. A system according to claim 5, wherein said first memory means, said processor means, said second memory means and said reading out means in combination form a data stripe processing module, comprising:
plural of data stripe processing modules for simultaneously processing respective data stripes corresponding to adjacent portions of said bit-map; and
second control means for controlling the reading out means of each of said modules so that said plural modules output a continuous series of bits of said bit-map spanning said plural data stripes.

7. A system according to claim 1, wherein means are provided for defining said bit-map as having first and second perpendicular axes and each of said polygons as having first and second opposed sides parallel to said second axis and third and fourth sides interconnecting said first and second sides.

8. A system according to claim 7, comprising:
means for forming said plural polygonal pattern data with:
a first field defining a first occurrence of the respective polygon with respect to said first axis, corresponding to the first scan line intersected by the respective polygon;
a second field defining respective slopes for said third and fourth sides;
a third field defining original start and stop addresses of first scan line bits firstly and lastly, respectively, intersected by said respective polygon; and
a fourth field defining a last occurrence of the respective polygon with respect to said first axis, corresponding to the last scan line intersected by the respective polygon.

9. A system according to claim 8, wherein said pattern data converting means comprises:
means for sorting said plural pattern data into a static table of plural linked data entries based on said first field of each of said pattern data, said static table including a list head which identifies for each scan line intersected by a polygon an address of a location in said first memory means which stores a selected field of one of data entries intersecting the respective scan line, said sorting means comprising means for changing each of the pattern data to a data entry by converting the first field of each of the pattern data to a pointer address of a selected field of a next of the pattern data corresponding to an additional polygon intersecting the same scan line and to a predetermined number when no additional polygon intersects said same scan line.

10. A system according to claim 9, wherein said pattern data converting means comprises:
means for forming an active table including each data entry corresponding to a polygon intersecting a scan line being processed by said processor means, said active list including a list head which identifies an address of a location in said first memory means of a selected field of one of the data entries corresponding to a scan line being processed, wherein the remaining data entries of the active table are sequentially linked by means of the pointer address defined by the first field of each data entry in the active table.

11. A system according to claim 10, wherein said active table forming means comprises:
means for transferring to said active table a data entry included in said static table and corresponding to a next to be processed scan line upon completion of processing of the active table data entries of the scan line immediately preceding said next to be processed scan line.

12. A system according to claim 11, comprising:
means for forming each data entry with a fifth field defining current start and stop bit addresses of bits in a current scan line intersected by the polygon corresponding to a data entry being processed when the polygon overlaps said first scan line and said current scan line; and
said processing means comprising means for incrementing the current start and stop bit addresses based on the slopes defined in said second field after determining the bits intersected by the polygon corresponding to the respective data entry in the current scan line.

13. A system according to claim 12, wherein said active table forming means comprises:
means for removing a data entry from the active table to the static table upon completion of processing of a last scan line intersected by the polygon corresponding to the respective data entry.

14. A system according to claim 13, comprising:
means for forming each data entry with:
a sixth field defining whether the polygon corresponding to the respective data entry is repeated within the bit-map;
a seventh field defining an origin scan line where repeating of a polygon to be repeated is next to begin being repeated; and
an eighth field defining an interval number of scan lines between origin scan lines of a polygon to be repeated.

15. A system according to claim 14, wherein said active table forming means comprises:
means for moving a data entry from the static table to the active table for processing of a repeated polygon based on said sixth, seventh and eighth fields; and
means for incrementing the seventh field of the data entry corresponding to the repeated polygon based on said eighth field of the repeated polygon after completing processing of the preceding same repeated polygon.

16. A system according to claim 6, wherein means are provided for defining said bit-map as having first and second perpendicular axes and each of said polygons as having first and second opposed sides parallel to said second axis and third and fourth sides interconnecting said first and second sides.

17. A system according to claim 16, comprising:
means for forming each of said plural polygonal pattern data with:
a first field defining a first occurrence of the respective polygon with respect to said first axis, corresponding to the first scan line intersected by the respective polygon;
a second field defining respective slopes for said third and fourth sides;
a third field defining original start and stop addresses of first scan line bits firstly and lastly, respectively, intersected by said respective polygon; and a fourth field defining a last occurrence of the respective polygon with respect to said first axis, corresponding to the last scan line intersected by the respective polygon.

18. A system according to claim 17, wherein said pattern data converting means comprises:

means for sorting said plural pattern data into a static table of plural linked data entries based on said first filed of each of said pattern data, said static table including a list head which identifies for each scan line intersected by a polygon an address of a location in said first memory means which stores a selected field of one of data entries intersecting the respective scan line, said sorting means comprising means for changing each of the pattern data to a data entry by converting the first field of each of the pattern data to a pointer address of a selected field of a next of the pattern data corresponding to an additional polygon intersecting the same scan line and to a predetermined number when no additional polygon intersects said same scan line.

19. A system according to claim 18, wherein said pattern data converting means comprises:

means for forming an active table including each data entry corresponding to a polygon intersecting a scan line being processed by said processor means, said active list including a list head which identifies an address of a location in said first memory means of a selected field of one of the data entries corresponding to a scan line being processed, wherein the remaining data entries of the active table are sequentially linked by mean of the pointer address defined by the first field of each data entry in the active table.

20. A system according to claim 19, wherein said active table forming means comprises:

means for transferring to said active table a data entry included in said static table and corresponding to a next to be processed scan line upon completion of processing of the active table data entries of the scan line immediately preceding said next to be processed scan line.

21. A system according to claim 20, comprising:

means for forming said data entry with a fifth defining current start and stop bit addresses of bits in a current scan line intersected by the polygon corresponding to a data entry being processed when the polygon overlaps said first scan line and said current scan line; and said processing means comprising means for incrementing the current start and stop bit addresses based on the slopes defined in said second field after determining the bits intersected by the polygon corresponding to the respective data entry in the current scan line.

22. A system according to claim 21, wherein said active table forming means comprises:

means for removing a data entry from the active table to the static table upon completion of processing of a last scan line intersected by the polygon corresponding to the respective data entry.

23. A system according to claim 22, comprising:

means for forming each data entry with:

a sixth field defining whether the polygon corresponding to the respective data entry is repeated within the bit-map;

a seventh field defining an origin scan line where repeating of a polygon to be repeated is next to begin being repeated; and an eighth field defining an interval number of scan lines between origin scan lines of a polygon to be repeated.

24. A system according to claim 23, wherein said active table forming means comprises:

means for moving a data entry from the static table to the active table for processing of a repeated polygon based on said sixth, seventh and eighth fields; and means for incrementing the seventh field of the data entry corresponding to the repeated polygon based on said eighth field of the repeated polygon after completing processing of the preceding same repeated polygon.

25. A system according to claim 1, wherein said reading out means comprises:

an optical fiber communication link for transmitting said bit-map data to a remote location.

26. A system according to claim 6, wherein said reading out means comprises:

an optical fiber communication link for transmitting said bit-map data to a remote location.

27. A system according to claim 15, wherein said reading out means comprises:

an optical fiber communication link for transmitting said bit-map data to a remote location.

28. A system according to claim 24, wherein said reading out means comprises:

an optical fiber communication link for transmitting said bit-map data to a remote location.

29. An exposure system in which an electron beam from an electron beam source selectively irradiates plural abutting stripe areas of a wafer, comprising:

a rasterization system for producing a two-dimensional bit-map of said wafer, wherein portions of the wafer to be irradiated are represented by bits in the bit-map having a first logic level and the remaining portions not to be irradiated are represented by the remaining bits in the bit-map having a second logic level, said rasterization system converting plural polygonal pattern data each defining the shape and location of a respective polygon in a two dimensional field into respective bits of said bit-map such that said respective bits and the locations thereof in said bit-map correspond to the shapes and locations of the polygons in said two dimensional field, wherein said bit-map is divided into plural data stripes and each data stripe includes plural scan lines, each scan line including plural bits, said rasterization system comprising, means for converting said plural pattern data of a data stripe into plural respective linked data entries such that data entries which correspond to polygons intersecting the same scan line are sequentially linked from one data entry to a next data entry, first memory means for storing said plural linked data entries, processor means coupled to said first memory means for receiving said plural linked data entries from said memory means and processing the received data entries by determining for each scan line the bits thereof intersected by each polygon represented by the respective linked data entries, said processor means setting each bit so determined to a predetermined logic state and producing bit-map data corresponding to the set bits, second memory means coupled to said processor means for storing said bit-map data for each scan line of said data stripe, wherein the two-dimensional bit-map of the plural polygonal pattern data corresponding to said data strip is formed and stored in said second memory means, and means for reading out sequentially the bit-map data stored in said second memory means; and means for selectively controlling irradiation of said wafer by said electron beam based on the bit-map data read out from said reading out means.

30. A system according to claim 29, wherein:

said first memory means comprises first and second double buffer memories interconnected such that one of said double buffer memories outputs to said processor means data entries corresponding to a first data stripe while the other of said double buffer memories receives and stores data entries corresponding to a second data stripe from said converting means; and said second memory means comprises third and fourth double buffer memories interconnected such that bit-map data corresponding to said first data stripe is being loaded into one of said third and fourth double buffer memories from said processor means while bit-map data corresponding to a third data stripe is being read out from the other of said third and fourth double buffer memories.

31. A system according to claim 30, wherein said processor means comprises:

a processor for determining, for each polygon corresponding to each linked data entry intersecting a scan line, a start point and a stop point where the polygon corresponding to said data entry intersects said scan line and for outputting start/stop words corresponding thereto; and a scan line bit producer for setting bits in each scan line in correspondence with said start/stop words.

32. A system according to claim 31, wherein said scan line bit producer comprises:

gating means having outputs corresponding to the number of bits in a scan line for decoding said start/stop words and outputting a predetermined logic level on the outputs of the gating means in correspondence with decoding of said start/stop words; and a first register having plural memory stages each having an input coupled to a respective gating means output and an output which is set after decoding by said gating means whenever said gating means outputs said predetermined logic level, said first register outputs remaining set, once set during processing of a scan line, for the duration of processing of said scan line.

33. A system according to claim 32, comprising:

said scan line bit producer comprising a second register having inputs coupled to the outputs of said first register and an output coupled to read inputs of said third and fourth double buffer memories;

first control means for transferring the outputs of said first register to said second register upon completion of processing of all data entries corresponding to a scan line, for the clearing said first register for processing of a next scan line, and for transferring the outputs transferred to said second register to said read inputs of said third and fourth double buffer memories.

34. A system according to claim 33, wherein said first memory means, said processor means, said second memory means and said reading out means in combination form a data stripe processing module, comprising:

plural data stripe processing modules for simultaneously processing respective data stripes corresponding to adjacent portions of said bit-map; and second control means for controlling the reading out means of each of said modules so that said plural modules output a continuous series of bits of said bit-map spanning said plural data stripes.

35. A system according to claim 29, wherein means are provided for defining said bit-map as having first and second perpendicular axes and each of said polygons as having first and second opposed sides parallel to said second axis and third and fourth sides interconnecting said first and second sides.

36. A system according to claim 35, comprising:

means for forming each of said plural polygonal pattern data with:

a first field defining a first occurrence of the respective polygon with respect to said first axis, corresponding to the first scan line intersected by the respective polygon;

a second field defining respective slopes for said third and fourth sides;

a third field defining original start and stop addresses of first scan line bits firstly and lastly, respectively, intersected by said respective polygon; and a fourth field defining a last occurrence of the respective polygon with respect to said first axis, corresponding to the last scan line intersected by the respective polygon.

37. A system according to claim 36, wherein said pattern data converting means comprises:

means for sorting said plural pattern data into a static table of plural linked data entries based on said first field of each of said pattern data, said static table including a list head which identifies for each scan line intersected by a polygon an address of a location in said first memory means which stores a selected field of one of data entries intersecting the respective scan line, said sorting means comprising means for changing each of the pattern data to a data entry by converting the first field of each of the pattern data to a pointer address of a selected field of a next of the pattern data corresponding to an additional polygon intersecting the same scan line and to a predetermined number when no additional polygon intersects said same scan line.

38. A system according to claim 37, wherein said pattern data converting means comprises:

means for forming an active table including each data entry corresponding to a polygon intersecting a scan line being processed by said processor means, said active list including a list head which identifies an address of a location in said first memory means of a selected field of one of the data entries corresponding to a scan line being processed, wherein the remaining data entries of the active table are sequentially linked by means of the pointer address defined by the first field of each data entry in the active table.

39. A system according to claim 38, wherein said active table forming means comprises:

means for transferring to said active table a data entry included in said static table and corresponding to a next to be processed scan line upon completion of processing of the active table data entries of the scan line immediately preceding said next to be processed scan line.

40. A system according to claim 39, comprising:

means for forming each data entry with a fifth field defining current start and stop bit addresses of bits in a current scan line intersected by the polygon corresponding to a data entry being processed when the polygon overlaps said first scan line and said current scan line; and said processing means comprising means for incrementing the current start and stop bit addresses based on the slopes defined in said second field after determining the bits intersected by the polygon corresponding to the respective data entry in the current scan line.

41. A system according to claim 40, wherein said active table forming means comprises:

means for removing a data entry from the active table to the static table upon completion of processing of a last scan line intersected by the polygon corresponding to the respective data entry.

42. A system according to claim 41, comprising:

means for forming data entry comprising:

a sixth field defining whether the polygon corresponding to the respective data entry is repeated within the bit-map; where a seventh field defining an origin scan line repeating of a polygon to be repeated is next to begin being repeated; and an eighth field defining an interval number of scan lines between origin scan lines of a polygon to be repeated.

43. A system according to claim 42, wherein said active table forming means comprises:

means for moving a data entry from the static table to the active table for processing of a repeated polygon based on said sixth, seventh and eighth fields; and means for incrementing the seventh field of the data entry corresponding to the repeated polygon based on said eighth field of the repeated polygon after completing processing of the preceding same repeated polygon.

44. A system according to claim 34, wherein means are provided for defining said bit-map as having first and second perpendicular axes and each of said polygons as having first and second opposed sides parallel to said second axis and third and fourth sides interconnecting said first and second sides.

45. A system according to claim 44, comprising:

means for forming each of said plural polygonal pattern data with:

a first field defining a first occurrence of the respective polygon with respect to said first axis, corresponding to the first scan line intersected by the respective polygon;

a second field defining respective slopes for said third and fourth sides; and a third field defining original start and stop addresses of first scan line bits firstly and lastly, respectively, intersected by said respective polygon; and a fourth field defining a last occurrence of the respective polygon with respect to said first axis, corresponding to the last scan line intersected by the respective polygon.

46. A system according to claim 45, wherein said pattern data converting means comprises:

means for sorting said plural pattern data into a static table of plural linked data entries based on said first field of each of said pattern data, said static table including a list head which identifies for each scan line intersected by a polygon an address of a location in said first memory means which stores a selected field of one of data entries intersecting the respective scan line, said sorting means comprising means for changing each of the pattern data to a data entry by converting the first field of each of the pattern data to a pointer address of a selected field of a next of the pattern data corresponding to an additional polygon intersecting the same scan line and to a predetermined number when no additional polygon intersects said same scan line.

47. A system according to claim 46, wherein said pattern data converting means comprises:

means for forming an active table including each data entry corresponding to a polygon intersecting a scan line being processed by said processor means, said active list including a list head which identifies an address of a location in said first memory means of a selected field of one of the data entries corresponding to a scan line being processed, wherein the remaining data entries of the active table are sequentially linked by means of the pointer address defined by the first field of each data entry in the active table.

48. A system according to claim 47, wherein said active table forming means comprises:

means for transferring to said active table a data entry included in said static table and corresponding to a next to be processed scan line upon completion of processing of the active table data entries of the scan line immediately preceding said next to be processed scan line.

49. A system according to claim 48, comprising:

means for forming each data entry with a fifth field defining current start and stop bit addresses of bits in a current scan line intersected by the polygon corresponding to a data entry being processed when the polygon overlaps said first scan line and said current scan line; and said processing means comprising means for incrementing the current start and stop bit addresses based on the slopes defined in said second field after determining the bits intersected by the polygon corresponding to the respective data entry in the current scan line.

50. A system according to claim 49, wherein said active table forming means comprises:

means for removing a data entry from the active table to the static table upon completion of processing of a last scan line intersected by the polygon corresponding to the respective data entry.

51. A system according to claim 50, comprising:

means for forming each data entry with:

a sixth field defining whether the polygon corresponding to the respective data entry is repeated within the bit-map;

a seventh field defining an origin scan line where repeating of a polygon to be repeated is next to begin being repeated; and an eighth field defining an interval number of scan lines between origin scan lines of a polygon to be repeated.

52. A system according to claim 51, wherein said active table forming means comprises:

means for moving a data entry from the static table to the active table for processing of a repeated polygon based on said sixth, seventh and eighth fields; and means for incrementing the seventh field of the data entry corresponding to the repeated polygon based on said eighth field of the repeated polygon after completing processing of the preceding same repeated polygon.

53. A system according to claim 29, wherein said reading out means comprises:

an optical fiber communication link for transmitting said bit-map data to an electron beam blanking device coupled to said electron beam source.

54. A system according to claim 34, wherein said reading out means comprises:

an optical fiber communication link for transmitting said bit-map data to an electron beam blanking device coupled to said electron beam source.

55. A system according to claim 43, wherein said reading out means comprises:

an optical fiber communication link for transmitting said bit-map data to an electron beam blanking device coupled to said electron beam source.

56. A system according to claim 52, wherein said reading out means comprises:

an optical fiber communication link for transmitting said bit-map data to an electron beam blanking device coupled to said electron beam source.

* * * * *